US011749543B2

(12) United States Patent
Lu et al.

(10) Patent No.: US 11,749,543 B2
(45) Date of Patent: Sep. 5, 2023

(54) CHAMBER MATCHING AND CALIBRATION

(71) Applicant: Applied Materials, Inc., Santa Clara, CA (US)

(72) Inventors: Xuesong Lu, San Jose, CA (US); Yu Lei, Belmont, CA (US); Anup Phatak, Santa Clara, CA (US); Hyman W. H. Lam, San Jose, CA (US); Chong Jiang, Cupertino, CA (US); Malcolm Emil Delaney, Los Gatos, CA (US); Yufei Hu, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 380 days.

(21) Appl. No.: 16/921,741

(22) Filed: Jul. 6, 2020

(65) Prior Publication Data
US 2022/0005713 A1 Jan. 6, 2022

(51) Int. Cl.
*H01L 21/67* (2006.01)
*H05B 1/02* (2006.01)
*G06N 3/08* (2023.01)

(52) U.S. Cl.
CPC ......... *H01L 21/67253* (2013.01); *G06N 3/08* (2013.01); *H05B 1/0233* (2013.01)

(58) Field of Classification Search
CPC ... H01L 21/67253; G06N 3/08; H05B 1/0233
See application file for complete search history.

(56) References Cited

U.S. PATENT DOCUMENTS

| 5,846,332 A * | 12/1998 | Zhao ...................... C23C 16/46 |
| | | 118/500 |
| 2015/0122775 A1* | 5/2015 | Sankarakrishnan ........................ |
| | | H01J 37/32477 |
| | | 118/723 R |
| 2018/0082826 A1* | 3/2018 | Guha .................. H01L 21/3065 |
| 2018/0138069 A1* | 5/2018 | Tan .................... H01L 21/67248 |
| 2018/0190526 A1* | 7/2018 | Hao .................. H01J 37/32082 |
| 2019/0013232 A1* | 1/2019 | Yan .................... H01J 37/32642 |
| 2020/0006102 A1* | 1/2020 | Lin .................... H01L 21/67259 |

(Continued)

FOREIGN PATENT DOCUMENTS

KR 1020200004684 A 1/2020

OTHER PUBLICATIONS

International Search Report and Written Opinion for International Application No. PCT/US2021/040214, dated Oct. 27, 2021.

*Primary Examiner* — Alexander Satanovsky
*Assistant Examiner* — Lyudmila Zaykova-Feldman
(74) *Attorney, Agent, or Firm* — Lowenstein Sandler LLP

(57) ABSTRACT

A method includes receiving a plurality of sets of sensor data associated with a processing chamber of a substrate processing system. Each of the plurality of sets of sensor data comprises a corresponding sensor value of the processing chamber mapped to a corresponding spacing value of the processing chamber. The method further includes providing the plurality of sets of sensor data as input to a trained machine learning model. The method further includes obtaining, from the trained machine learning model, one or more outputs indicative of a health of the processing chamber. The method further includes causing, based on the one or more outputs, performance of one or more corrective actions associated with the processing chamber.

18 Claims, 7 Drawing Sheets

(56) References Cited

U.S. PATENT DOCUMENTS

2020/0013657 A1\* 1/2020 Lee ................... H01J 37/32642
2020/0185194 A1\* 6/2020 Albarede .......... H01J 37/32541
2022/0328290 A1\* 10/2022 Mishra .............. H01J 37/32642

\* cited by examiner

CHAMBER MATCHING AND CALIBRATION

TECHNICAL FIELD

The present disclosure relates to matching and calibration, and, more particularly, chamber matching and calibration in substrate processing systems.

BACKGROUND

In manufacturing systems, products are produced by performing one or more manufacturing processes using manufacturing equipment. For example, processing chambers are used to process substrates in a substrate processing system. Errors in calibration and installation of components in manufacturing systems cause defective products, unscheduled down time, and equipment damage.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a method includes receiving a plurality of sets of sensor data associated with a processing chamber of a substrate processing system. Each of the plurality of sets of sensor data comprises a corresponding sensor value of the processing chamber mapped to a corresponding spacing value of the processing chamber. The method further includes providing the plurality of sets of sensor data as input to a trained machine learning model. The method further includes obtaining, from the trained machine learning model, one or more outputs indicative of a health of the processing chamber. The method further includes causing, based on the one or more outputs, performance of one or more corrective actions associated with the processing chamber.

In another aspect of the disclosure, a method includes receiving a plurality of sets of historical sensor data associated with one or more processing chambers of one or more substrate processing systems. Each of the plurality of sets of historical sensor data comprises a corresponding historical sensor value mapped to a corresponding historical spacing value. The method further includes receiving a plurality of sets of historical performance data associated with the one or more processing chambers. Each of the plurality of sets of historical performance data corresponds to a respective set of historical sensor data of the plurality of sets of historical sensor data. The method further includes training a machine learning model with data input comprising the plurality of sets of historical sensor data and target output comprising the plurality of sets of historical performance data to generate a trained machine learning model, the trained machine learning model being capable of generating one or more outputs indicative of a health of a processing chamber to cause performance of one or more corrective actions associated with the processing chamber of a substrate processing system.

In another aspect of the disclosure, a non-transitory machine-readable storage medium storing instructions which, when executed cause a processing device to perform operations including receiving a plurality of sets of sensor data associated with a processing chamber of a substrate processing system. Each of the plurality of sets of sensor data comprises a corresponding sensor value of the processing chamber mapped to a corresponding spacing value of the processing chamber. The operations further include providing the plurality of sets of sensor data as input to a trained machine learning model. The operations further include obtaining, from the trained machine learning model, one or more outputs indicative of data health of the processing chamber. The operations further include causing, based on the one or more outputs, performance of one or more corrective actions associated with the processing chamber.

BRIEF DESCRIPTION OF THE DRAWINGS

The present disclosure is illustrated by way of example, and not by way of limitation in the figures of the accompanying drawings.

DETAILED DESCRIPTION

Figure 1A:
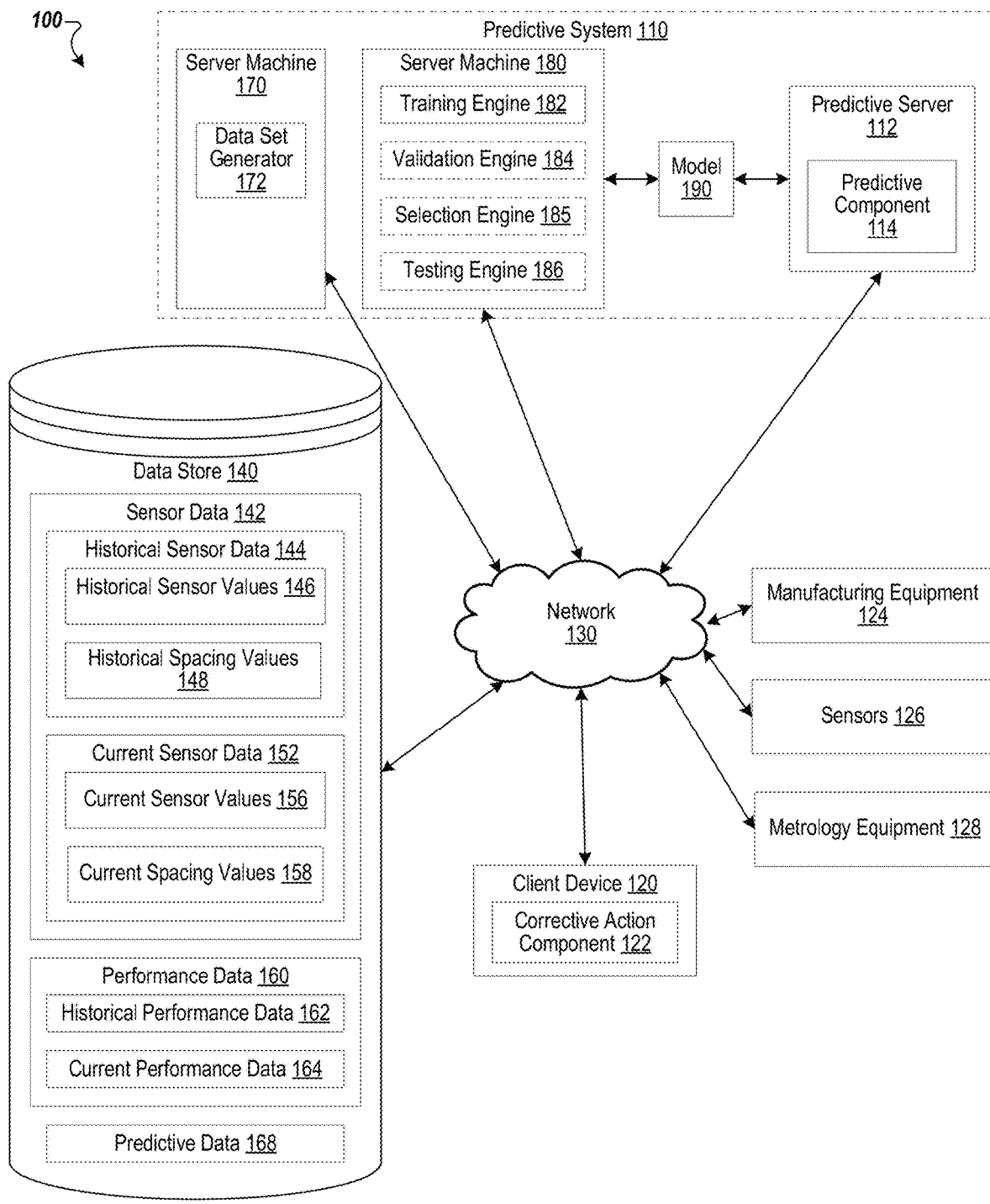
FIG. 1A is a block diagram illustrating an exemplary system architecture, according to certain embodiments.

Described herein are technologies directed to chamber matching and calibration.

Manufacturing equipment is used to produce products. For example, equipment, such as processing chambers, are used to process substrates in a substrate processing system. Components, such as process kit rings, are installed in processing chambers. Components are installed and/or calibrated during a new installation (e.g., commissioning) and after periodical maintenance, cleaning, replacement, and/or the like. For example, during a new installation and during preventative maintenance, a process kit ring is installed and heater spacing is calibrated.

Conventionally, after installation and preventative maintenance, components (e.g., process kit ring, heater block, etc.) are installed and/or calibrated and then the components are used to process wafers. Errors in installation and/or calibration lead to chamber mismatch and product inconsistencies between processing chambers. In some examples, the errors in installation and/or calibration are identified after producing defective substrates. Upon identifying errors, the substrate processing system is opened, the components are re-installed and/or re-calibrated, the substrate processing system goes through a long requalification process, the substrate processing system is used to produce more substrates, and the substrates are examined to determine whether the re-installed and/or re-calibrated components have further errors. This process is repeated until there are no further errors. This process produces defective substrates, wastes materials, causes equipment damage, results in unscheduled down time, and reduces throughput.

The devices, systems, and methods disclosed herein provide chamber matching and calibration. A processing device receives sensor data associated with a processing chamber of a substrate processing system. In some embodiments, the sensor data is received after the substrate processing system has been closed following commissioning, installation, calibration, and/or preventative maintenance. The sensor data includes sensor values (e.g., pressure values of the processing chamber, pumping efficiency value associated with the processing chamber) mapped to spacing values of the processing chamber. In some embodiments, the spacing values include distances (e.g., choking distances) between an edge ring of the processing chamber and a ceramic isolator of the processing chamber and the sensor values are associated with exhaust pressure through an opening corresponding to the distances (e.g., choking distances). In some embodiments, the spacing values are directed spacing values (e.g., spacing values to which a controller of the substrate processing system directed the heater block to be positioned, different from the actual measured spacing values responsive to an error in calibration) and the sensor values are actual pressure values measured by a sensor (e.g., pressure gauge located below a choking point in the processing chamber).

The processing device provides the sensor data (e.g., actual pressure values and directed spacing values) as input to a trained machine learning model and obtains, from the machine learning model, outputs indicative of predictive data (e.g., indicative of a health of the processing chamber). The processing device causes performance of a corrective action associated with the processing chamber based on the one or more outputs (e.g., the predictive data, outputs indicative of the health of the processing chamber).

In some embodiments, the predictive data (e.g., outputs indicative of a health of the processing chamber) is indicative of an error in calibration of the heater spacing of the processing chamber and the performance of the corrective action includes providing an alert and/or causing recalibration of the heater spacing of the processing chamber. In some examples, the predictive data (e.g., outputs indicative of a health of the processing chamber) indicates that the resulting sensor values do not match the spacing values of properly calibrated processing chambers. In some embodiments, the processing device determines an absolute value or a relative value (e.g., percentage) to be used to correct the calibration of the heater spacing (e.g., the calibration is off by 50 thousands of an inch (mil)).

In some embodiments, the predictive data (e.g., outputs indicative of a health of the processing chamber) is indicative of an error in installation of a process kit ring in the processing chamber and the performance of the corrective action includes providing an alert and/or causing re-calibration of the process kit ring in the processing chamber. In some examples, the predictive data (e.g., health of the processing chamber) indicates that the resulting sensor values mapped to spacing values do not match the sensor values mapped to spacing values of processing chambers that have properly installed process kit rings. In some embodiments, the processing device determines an absolute value or a relative value (e.g., percentage) to be used to correct the installation of the process kit ring (e.g., the process kit ring is incorrectly rotated 180 degrees compared to correct installation).

In some embodiments, a processing device trains a machine learning model to be used to generate outputs indicative of predictive data (e.g., outputs indicative of a health of the processing chamber) to cause performance of a corrective action. The processing device receives historical sensor data associated with processing chambers of substrate processing systems. The historical sensor data includes historical sensor values mapped to historical spacing values. The processing device receives historical performance data that corresponds to the historical sensor data. In some embodiments, the historical performance data indicates that the heater spacing was correctly calibrated and/or the process kit ring was correctly installed. In some embodiments, the historical performance data indicates an absolute value or a relative value (e.g., percentage) of error in the calibration of the heater spacing and/or installation of the process kit ring. The processing device trains a machine learning model with data input including the historical sensor data and target output including the historical performance data to generate the trained machine learning model that is capable of generating outputs indicative of predictive data (e.g., outputs indicative of a health of the processing chamber) to cause performance of a corrective action associated with a processing chamber.

Aspects of the present disclosure result in technological advantages. The present disclosure provides for predicting whether there are errors in calibration and installation prior to processing substrates and without re-opening the substrate processing system. This reduces defective substrates, reduces wasted material, reduces equipment damage, reduces unscheduled downtime, and increases throughput compared to conventional systems. In some embodiments, the predicting of whether there are errors in calibration and installation is repeated after performance of the corrective action to determine if there are any further errors. This also reduces waste of time and resources and increases throughput compared to conventional systems. The present disclosure provides for correctly calibrating and correctly installing components which provides for better quality products that conventional systems. The present disclosure provides for chamber matching between different processing chambers so that the calibration (e.g., heater spacing calibration) and installation (e.g., of process kit rings) is consistent across processing chambers and substrate processing systems to produce more consistent substrates.

FIG. 1A is a block diagram illustrating an exemplary system 100 (exemplary system architecture), according to certain embodiments. The system 100 includes a client device 120, manufacturing equipment 124, sensors 126, metrology equipment 128, a predictive server 112, and a data store 140. In some embodiments, the predictive server 112 is part of a predictive system 110. In some embodiments, the predictive system 110 further includes server machines 170 and 180.

In some embodiments, one or more of the client device 120, manufacturing equipment 124, sensors 126, metrology equipment 128, predictive server 112, data store 140, server machine 170, and/or server machine 180 are coupled to each other via a network 130 for generating predictive data 168 (e.g., outputs indicative of a health of the processing chamber) to perform corrective actions. In some embodiments, network 130 is a public network that provides client device 120 with access to the predictive server 112, data store 140, and other publically available computing devices. In some embodiments, network 130 is a private network that provides client device 120 access to manufacturing equipment 124, sensors 126, metrology equipment 128, data store 140, and other privately available computing devices. In some embodiments, network 130 includes one or more Wide Area Networks (WANs), Local Area Networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/ or a combination thereof.

In some embodiments, the client device 120 includes a computing device such as Personal Computers (PCs), laptops, mobile phones, smart phones, tablet computers, netbook computers, etc. In some embodiments, the client device 120 includes a corrective action component 122. Client device 120 includes an operating system that allows users to one or more of generate, view, or edit data (e.g., indication associated with manufacturing equipment 124, corrective actions associated with manufacturing equipment 124, etc.).

In some embodiments, corrective action component 122 receives user input (e.g., via a Graphical User Interface (GUI) displayed via the client device 120) of an indication associated with manufacturing equipment 124. In some embodiments, the corrective action component 122 transmits the indication to the predictive system 110, receives output (e.g., predictive data 168) from the predictive system 110, determines a corrective action associated with the manufacturing equipment 124 based on the output, and causes the corrective action to be implemented. In some embodiments, the corrective action component 122 obtains sensor data 142 (e.g., current sensor data 152) associated with the manufacturing equipment 124 (e.g., from data store 140, etc.) and provides the sensor data 142 (e.g., current sensor data 152) associated with the manufacturing equipment 124 to the predictive system 110. In some embodiments, the corrective action component 122 stores sensor data 142 in the data store 140 and the predictive server 112 retrieves the sensor data 142 from the data store 140. In some embodiments, the predictive server 112 stores output (e.g., predictive data 168) of the trained machine learning model 190 in the data store 140 and the client device 120 retrieves the output from the data store 140. In some embodiments, the corrective action component 122 receives an indication of a corrective action from the predictive system 110 and causes the corrective action to be implemented.

In some embodiments, a corrective action is associated with one or more of Computational Process Control (CPC), Statistical Process Control (SPC) (e.g., SPC to compare to a graph of 3-sigma, etc.), Advanced Process Control (APC), model-based process control, preventative operative maintenance, design optimization, updating of manufacturing parameters, feedback control, machine learning modification, or the like.

In some embodiments, the corrective action includes providing an alert (e.g., an alarm to not use the processing chamber for substrate processing if the predictive data 168 indicates a predicted abnormality, such as an abnormality of the product, a component, manufacturing equipment 124, or health of the processing chamber). In some embodiments, the corrective action includes providing feedback control (e.g., modifying calibration responsive to the predictive data 168 indicating a predicted abnormality). In some embodiments, the corrective action includes providing machine learning (e.g., causing modification of one or more of calibration or installation based on the predictive data 168). In some embodiments, performance of the corrective action includes causing updates to one or more of calibration and/or installation of one or more components of the manufacturing equipment 124. In some embodiments, the corrective action includes causing preventative maintenance (e.g., re-calibration and/or re-installation of one or more components of the manufacturing equipment 124).

In some embodiments, the predictive server 112, server machine 170, and server machine 180 each include one or more computing devices such as a rackmount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc.

The predictive server 112 includes a predictive component 114. In some embodiments, the predictive component 114 receives sensor data 142 (e.g., receive from the client device 120, retrieve from the data store 140) and generates output (e.g., predictive data 168) for performing corrective action associated with the manufacturing equipment 124 based on the sensor data 142. In some embodiments, the predictive component 114 uses one or more trained machine learning models 190 to determine the output for performing the corrective action based on the sensor data 142. In some embodiments, trained machine learning model 190 is trained using historical sensor data 146 and historical performance data 162.

In some embodiments, the predictive system 110 (e.g., predictive server 112, predictive component 114) generates predictive data 168 (e.g., outputs indicative of a health of the processing chamber) using supervised machine learning (e.g., supervised data set, performance data 160 includes an indication of whether the processing chamber had errors in calibration and/or installation, etc.). In some embodiments, the predictive system 110 generates predictive data 168 using semi-supervised learning (e.g., semi-supervised data set, performance data 160 is a predictive percentage, etc.). In some embodiments, the predictive system 110 generates predictive data 168 using unsupervised machine learning (e.g., unsupervised data set, clustering, clustering based on performance data 160, etc.).

In some embodiments, the manufacturing equipment 124 (e.g., cluster tool) is part of a substrate processing system (e.g., integrated processing system). The manufacturing equipment 124 includes one or more of a controller, an enclosure system (e.g., substrate carrier, front opening unified pod (FOUP), autoteach FOUP, process kit enclosure system, substrate enclosure system, cassette, etc.), a side storage pod (SSP), an aligner device (e.g., aligner chamber), a factory interface (e.g., equipment front end module (EFEM)), a load lock, a transfer chamber, one or more processing chambers, a robot arm (e.g., disposed in the transfer chamber, disposed in the front interface, etc.), and/or the like. The enclosure system, SSP, and load lock mount to the factory interface and a robot arm disposed in the factory interface is to transfer content (e.g., substrates, process kit rings, carriers, validation wafer, etc.) between the enclosure system, SSP, load lock, and factory interface. The aligner device is disposed in the factory interface to align the content. The load lock and the processing chambers mount to the transfer chamber and a robot arm disposed in the transfer chamber is to transfer content (e.g., substrates, process kit rings, carriers, validation wafer, etc.) between the load lock, the processing chambers, and the transfer chamber. In some embodiments, the manufacturing equipment 124 includes processing chambers from substrate processing systems. In some embodiments, the manufacturing equipment 124 is installed and/or calibrated responsive to one or more of initial installation, commissioning, preventative maintenance, replacement of one or more components of the manufacturing equipment 124, cleaning, and/or the like. In some embodiments, manufacturing equipment 124 has one or more errors in installation and/or calibration. In some embodiments, a process kit ring is in an incorrectly rotated position in the manufacturing equipment 124. In some examples, the heater spacing is incorrectly calibrated in the manufacturing equipment. If gone uncorrected, errors in installation and/or calibration cause damage to products and/or the manufacturing equipment 124, increase in unscheduled downtime, and/or decrease in throughput.

In some embodiments, the sensors 126 provide sensor data 142 associated with manufacturing equipment 124. In some embodiments, the sensors 126 provide sensor values (e.g., historical sensor values 146, current sensor values 156) and/or spacing values (e.g., historical spacing values 148, current spacing values 158). In some embodiments, the sensors 126 include one or more of a pressure sensor (e.g., pressure gauge below the choking point in the processing chamber) and/or a distance sensor. In some embodiments, the sensors 126 provide the sensor data 142 during exhaust of gas from a processing chamber of the manufacturing equipment 124 while the heater spacing is being set to different spacing values. In some embodiments, the sensor data is used for equipment health and/or product health (e.g., product quality). The sensor data 142 is received over a period of time (e.g., corresponding to exhausting at different spacing values).

In some embodiments, sensors 126 include additional sensors that provide other types of sensor data 142. In some embodiments, the sensor data 142 includes values of one or more of leak rate, temperature (e.g., processing chamber temperature), pumping efficiency, gate value position, gas flow, spacing (SP), pressure, High Frequency Radio Frequency (HFRF), voltage of Electrostatic Chuck (ESC), electrical current, power, voltage, etc. In some embodiments, sensor data 142 is associated with or indicative of manufacturing parameters such as hardware parameters (e.g., settings or components (e.g., size, type, etc.) of the manufacturing equipment 124) or process parameters of the manufacturing equipment. In some embodiments, sensor data 142 is provided while the manufacturing equipment 124 performs manufacturing processes (e.g., equipment readings when processing products), before the manufacturing equipment 124 performs manufacturing processes, and/or after the manufacturing equipment 124 performs manufacturing processes. In some examples, the sensor data 142 is provided after commissioning, installation, preventative maintenance, and/or replacement of a component. In some embodiments, the sensor data 142 is provided while the manufacturing equipment 124 provides a sealed environment (e.g., the substrate processing system and/or processing chamber are closed.)

In some embodiments, the sensor data 142 (e.g., historical sensor data 144, current sensor data 152, etc.) is processed (e.g., by the client device 120 and/or by the predictive server 112). In some embodiments, processing of the sensor data 142 includes generating features. In some embodiments, the features are a pattern in the sensor data 142 (e.g., slope, width, height, peak, etc.) or a combination of sensor values from the sensor data 142 (e.g., power derived from voltage and current, etc.). In some embodiments, the sensor data 142 includes features and the features are used by the predictive component 114 for obtaining predictive data 168 for performance of a corrective action.

In some embodiments, the metrology equipment 128 is used to determine metrology data corresponding to products of the manufacturing equipment 124. In some examples, after the manufacturing equipment 124 deposits one or more layers on a substrate, the metrology equipment 128 is used to determine one or more of thicknesses of the layers, uniformity of the layers, interlayer spacing of the layer, or the like. In some embodiments, the metrology equipment 128 includes an imaging device.

In some embodiments, the data store 140 is a memory (e.g., random access memory), a drive (e.g., a hard drive, a flash drive), a database system, or another type of component or device capable of storing data. In some embodiments, data store 140 includes multiple storage components (e.g., multiple drives or multiple databases) that span multiple computing devices (e.g., multiple server computers). In some embodiments, the data store 140 stores one or more of sensor data 142, performance data 160, and/or predictive data 168.

Sensor data 142 includes historical sensor data 144 and current sensor data 152. Historical sensor data 144 includes historical sensor values 146 (e.g., historical pressure values, historical pumping efficiency values, etc.) and historical spacing values 148. Current sensor data 152 includes current sensor values 156 (e.g., current pressure values, current pumping efficiency values, etc.) and current spacing values 158. In some embodiments, the sensor data 142 includes pressure data (e.g., obtained while the pumping efficiency is held constant). In some embodiments, the sensor data 142 includes pumping efficiency (e.g., obtained while the pressure is held constant).

In some embodiments, the historical sensor values 146 and/or the current sensor values 156 are measured via one or more sensors 126. In some embodiments, the historical spacing values 148 and/or current spacing values 158 are the spacing values to which the processing chamber (e.g., edge ring) is directed to be located (e.g., the actual spacing values are different from the directed spacing values in miscalibrated processing chambers). In some embodiments, the performance data 160 is associated with a difference between the actual spacing values (e.g., measured by metrology equipment 128) and the directed spacing values (e.g., directed by a controller of the manufacturing equipment 124, directed by predictive server 112, etc.).

Performance data 160 includes historical performance data 162 and current performance data 164. In some embodiments, the performance data 160 is indicative of whether the manufacturing equipment 124 is functioning properly. In some examples, the performance data 160 is indicative of whether one or more components (e.g., one or more components of a process kit ring, such as edge ring 103 of FIGS. 1B-C, inner shield 105 of FIGS. 1B C, and/or the like) are correctly installed and/or whether one or more components are correctly calibrated (e.g., heater spacing calibration). In some embodiments, at least a portion of the performance data 160 is associated with a quality of products produced by the manufacturing equipment 124. In some embodiments, at least a portion of the performance data 160 is based on metrology data from the metrology equipment 128 (e.g., historical performance data 162 indicates correctly installed and calibrated processing chambers corresponding to metrology data indicating properly processed substrates, property data of substrates, yield, etc.). In some embodiments, at least a portion of the performance data 160 is based on inspection of the manufacturing equipment 124 (e.g., current performance data 164 based on verification of actual calibration or actual installation). In some embodiments, the performance data 160 includes an indication of an absolute value (e.g., heater spacing is 50 mil off, one or more components of the process kit ring is rotated 180 degrees incorrectly) or a relative value (e.g., heater spacing is 20% off, one or more components of the process kit ring is rotated 50% incorrectly, and/or the like). In some embodiments, the performance data 160 is indicative of meeting a threshold amount of error (e.g., at least 5% miscalibration, at least rotated 5% incorrectly, specification limit).

In some embodiments, the client device 120 provides performance data 160 (e.g., product data, equipment data). In some examples, the client device 120 provides (e.g., based on user input) performance data 160 that indicates an abnormality in products (e.g., defective products) and/or manufacturing equipment 124 (e.g., component failure, maintenance, energy usage, variance of a component compared to similar components, etc.). In some embodiments, the performance data 160 includes an amount of products that have been produced that were normal or abnormal (e.g., 98% normal products). In some embodiments, the performance data 160 indicates an amount of products that are being produced that are predicted as normal or abnormal. In some embodiments, the performance data 160 includes one or more of yield a previous batch of products, average yield, predicted yield, predicted amount of defective or non-defective product, or the like. In some examples, responsive to yield on a first batch of product being 98% (e.g., 98% of the products were normal and 2% were abnormal), the client device 120 provides performance data 160 indicating that the upcoming batch of product is to have a yield of 98%.

Historical data includes one or more of historical sensor data 144 and/or historical performance data 162 (e.g., at least a portion for training the machine learning model 190). Current data includes one or more of current sensor data 152 and/or current performance data 164 (e.g., at least a portion to be input into the trained machine learning model 190 subsequent to training the model 190 using the historical data) for which predictive data 168 is generated (e.g., for performing corrective actions). In some embodiments, the current data is used for retaining the trained machine learning model 190.

The predictive data 168 is indicative of predictive performance data of manufacturing equipment 124 (e.g., outputs indicative of a health of the processing chamber). In some examples, the predictive data 168 is indicative of predicted error in calibration (e.g., of heater spacing) and/or installation (e.g., of a process kit ring). In some embodiments, the predictive data 168 is indicative of whether a predicted error value is greater than an error threshold value. In some embodiments, the predictive data 168 is indicative of an absolute value or relative value of error. In some embodiments, the predictive data 168 is associated with one or more of predicted property data (e.g., of products to be produced or that have been produced using current sensor data 152), predicted metrology data (e.g., virtual metrology data of the products to be produced or that have been produced using current sensor data 152), an indication of abnormalities (e.g., abnormal products, abnormal components, abnormal manufacturing equipment 124, abnormal energy usage, abnormal installation, abnormal calibration, etc.), one or more causes of abnormalities or errors, and/or indication of an end of life of a component of manufacturing equipment 124.

Performing metrology on products to determine incorrectly calibrated and/or installed components is costly in terms of time used, metrology equipment 128 used, energy consumed, bandwidth used to send the metrology data, processor overhead to process the metrology data, etc. By inputting sensor data 142 and receiving output of predictive data 168, system 100 has the technical advantage of avoiding the costly process of using metrology equipment 128 to generate current performance data 164 for current sensor data 152.

Performing manufacturing processes (e.g., with errors in calibration and/or installation) that result in defective products is costly in time, energy, products, components, manufacturing equipment 124, the cost of identifying the defects and discarding the defective product, etc. By inputting sensor data 142, receiving output of predictive data 168, and performing a corrective action based on the predictive data 168, system 100 has the technical advantage of avoiding the cost of producing, identifying, and discarding defective products.

Performing manufacturing processes (e.g., with errors in calibration and/or installation) that result in failure of the components of the manufacturing equipment 124 is costly in downtime, damage to products, damage to equipment, express ordering replacement components, etc. By inputting sensor data 142, receiving output of predictive data 168, and performing corrective action (e.g., re-calibration, re-installation, etc. of components) based on the predictive data 168, system 100 has the technical advantage of avoiding the cost of one or more of unexpected component failure, unscheduled downtime, productivity loss, unexpected equipment failure, product scrap, and the like.

In some embodiments, manufacturing parameters are suboptimal (e.g., incorrectly calibrated, etc.) for producing product which has costly results of increased resource (e.g., energy, coolant, gases, etc.) consumption, increased amount of time to produce the products, increased component failure, increased amounts of defective products, etc. By inputting the sensor data 142 into the trained machine learning model 190, receiving an output of predictive data 168, and performing (e.g., based on the predictive data 168) a corrective action of updating manufacturing parameters (e.g., via re-calibration and/or re-installation of calibration), system 100 has the technical advantage of using optimal manufacturing parameters (e.g., correct calibration, correct installation, etc.) to avoid costly results of suboptimal manufacturing parameters.

In some embodiments, predictive system 110 further includes server machine 170 and server machine 180. Server machine 170 includes a data set generator 172 that is capable of generating data sets (e.g., a set of data inputs and a set of target outputs) to train, validate, and/or test a machine learning model(s) 190. Some operations of data set generator 172 are described in detail below with respect to FIGS. 2 and 4A. In some embodiments, the data set generator 172 partitions the historical data (e.g., historical sensor data 144 and historical performance data 162) into a training set (e.g., sixty percent of the historical data), a validating set (e.g., twenty percent of the historical data), and a testing set (e.g., twenty percent of the historical data). In some embodiments, the predictive system 110 (e.g., via predictive component 114) generates multiple sets of features. In some examples a first set of features corresponds to a first set of types of sensor data (e.g., from a first set of sensors, first combination of values from first set of sensors, first patterns in the values from the first set of sensors) that correspond to each of the data sets (e.g., training set, validation set, and testing set) and a second set of features correspond to a second set of types of sensor data (e.g., from a second set of sensors different from the first set of sensors, second combination of values different from the first combination, second patterns different from the first patterns) that correspond to each of the data sets.

Server machine 180 includes a training engine 182, a validation engine 184, selection engine 185, and/or a testing engine 186. In some embodiments, an engine (e.g., training engine 182, a validation engine 184, selection engine 185, and a testing engine 186) refers to hardware (e.g., circuitry, dedicated logic, programmable logic, microcode, processing device, etc.), software (such as instructions run on a processing device, a general purpose computer system, or a dedicated machine), firmware, microcode, or a combination thereof. The training engine 182 is capable of training a machine learning model 190 using one or more sets of features associated with the training set from data set generator 172. In some embodiments, the training engine 182 generates multiple trained machine learning models 190, where each trained machine learning model 190 corresponds to a distinct set of features of the training set (e.g., sensor data from a distinct set of sensors). In some examples, a first trained machine learning model was trained using all features (e.g., X1-X5), a second trained machine learning model was trained using a first subset of the features (e.g., X1, X2, X4), and a third trained machine learning model was trained using a second subset of the features (e.g., X1, X3, X4, and X5) that partially overlaps the first subset of features.

The validation engine 184 is capable of validating a trained machine learning model 190 using a corresponding set of features of the validation set from data set generator 172. For example, a first trained machine learning model 190 that was trained using a first set of features of the training set is validated using the first set of features of the validation set. The validation engine 184 determines an accuracy of each of the trained machine learning models 190 based on the corresponding sets of features of the validation set. The validation engine 184 discards trained machine learning models 190 that have an accuracy that does not meet a threshold accuracy. In some embodiments, the selection engine 185 is capable of selecting one or more trained machine learning models 190 that have an accuracy that meets a threshold accuracy. In some embodiments, the selection engine 185 is capable of selecting the trained machine learning model 190 that has the highest accuracy of the trained machine learning models 190.

The testing engine 186 is capable of testing a trained machine learning model 190 using a corresponding set of features of a testing set from data set generator 172. For example, a first trained machine learning model 190 that was trained using a first set of features of the training set is tested using the first set of features of the testing set. The testing engine 186 determines a trained machine learning model 190 that has the highest accuracy of all of the trained machine learning models based on the testing sets.

In some embodiments, the machine learning model 190 refers to the model artifact that is created by the training engine 182 using a training set that includes data inputs and corresponding target outputs (correct answers for respective training inputs). Patterns in the data sets can be found that map the data input to the target output (the correct answer), and the machine learning model 190 is provided mappings that captures these patterns. In some embodiments, the machine learning model 190 uses one or more of Support Vector Machine (SVM), Radial Basis Function (RBF), clustering, supervised machine learning, semi-supervised machine learning, unsupervised machine learning, k-Nearest Neighbor algorithm (k-NN), linear regression, random forest, neural network (e.g., artificial neural network), etc. In some embodiments, the machine learning model 190 is a multi-variable analysis (MVA) model.

Predictive component 114 provides current sensor data 152 to the trained machine learning model 190 and runs the trained machine learning model 190 on the input to obtain one or more outputs. The predictive component 114 is capable of determining (e.g., extracting) predictive data 168 from the output of the trained machine learning model 190 and determines (e.g., extract) confidence data from the output that indicates a level of confidence that the predictive data 168 corresponds to current performance data 164 (e.g., model 190) of the manufacturing equipment 124 at the current sensor data 152. In some embodiments, the predictive component 114 or corrective action component 122 use the confidence data to decide whether to cause a corrective action associated with the manufacturing equipment 124 based on the predictive data 168.

The confidence data includes or indicates a level of confidence that the predictive data 168 corresponds to current performance data 164 (e.g., model 190) of the manufacturing equipment 124 at the current sensor data 152. In one example, the level of confidence is a real number between 0 and 1 inclusive, where 0 indicates no confidence that the predictive data 168 corresponds to current performance data 164 associated with the current sensor data 152 and 1 indicates absolute confidence that the predictive data 168 corresponds to current performance data 164 associated with the current sensor data 152. In some embodiments, the system 100 uses predictive system 110 to determine predictive data 168 instead of processing substrates and using the metrology equipment 128 to determine current performance data 164. In some embodiments, responsive to the confidence data indicating a level of confidence that is below a threshold level, the system 100 causes processing of substrates and causes the metrology equipment 128 to generate the current performance data 164. Responsive to the confidence data indicating a level of confidence below a threshold level for a predetermined number of instances (e.g., percentage of instances, frequency of instances, total number of instances, etc.) the predictive component 114 causes the trained machine learning model 190 to be re-trained (e.g., based on the current sensor data 152 and current performance data 164, etc.).

Figure 2:
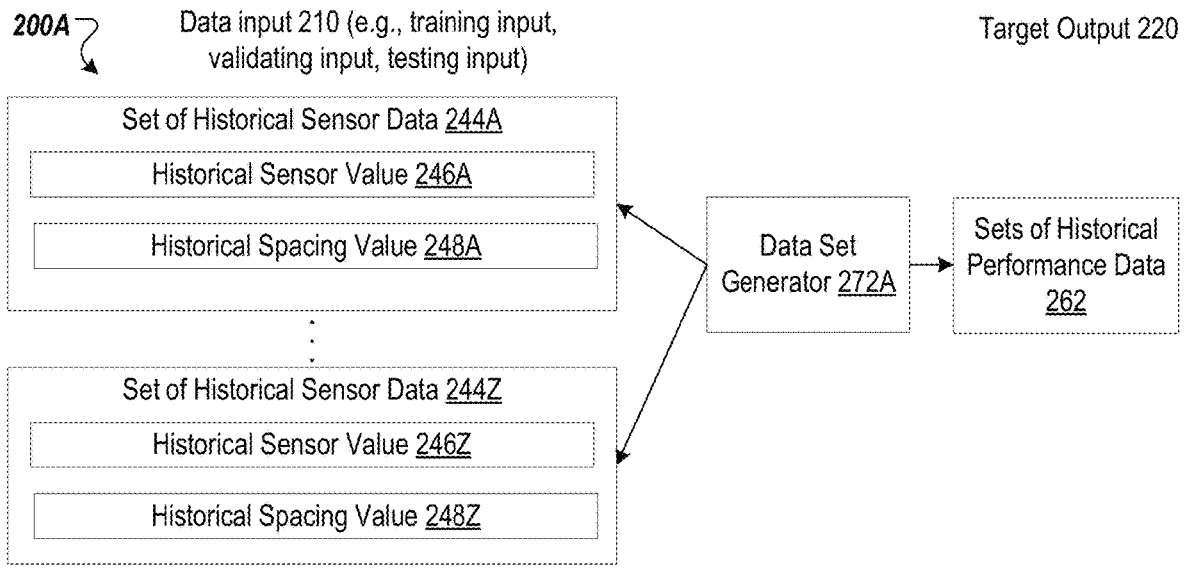
FIG. 2 illustrates a data set generator to create data sets for a machine learning model, according to certain embodiments.

For purpose of illustration, rather than limitation, aspects of the disclosure describe the training of one or more machine learning models 190 using historical data (e.g., historical sensor data 144 and historical performance data 162) and inputting current data (e.g., current sensor data 152) into the one or more trained machine learning models 190 to determine predictive data 168 (e.g., current performance data 164). In other implementations, a heuristic model or rule-based model is used to determine predictive data 168 (e.g., without using a trained machine learning model). Predictive component 114 monitors historical sensor data 144 and historical performance data 162. In some embodiments, any of the information described with respect to data inputs 210 of FIG. 2 are monitored or otherwise used in the heuristic or rule-based model. In some embodiments, predictive component 114 generates pumping curves (e.g., FIGS. 5A-B) based on historical sensor data 144 and compares the current sensor data 152 to the pumping curves to determine predictive data 168 (e.g., with or without using a trained machine learning model) to cause performance of a corrective action.

In some embodiments, the functions of client device 120, predictive server 112, server machine 170, and server machine 180 are be provided by a fewer number of machines. For example, in some embodiments, server machines 170 and 180 are integrated into a single machine, while in some other embodiments, server machine 170, server machine 180, and predictive server 112 are integrated into a single machine. In some embodiments, client device 120 and predictive server 112 are integrated into a single machine.

In general, functions described in one embodiment as being performed by client device 120, predictive server 112, server machine 170, and server machine 180 can also be performed on predictive server 112 in other embodiments, if appropriate. In addition, the functionality attributed to a particular component can be performed by different or multiple components operating together. For example, in some embodiments, the predictive server 112 determines the corrective action based on the predictive data 168. In another example, client device 120 determines the predictive data 168 based on output from the trained machine learning model.

In addition, the functions of a particular component can be performed by different or multiple components operating together. In some embodiments, one or more of the predictive server 112, server machine 170, or server machine 180 are accessed as a service provided to other systems or devices through appropriate application programming interfaces (API).

In some embodiments, a "user" is represented as a single individual. However, other embodiments of the disclosure encompass a "user" being an entity controlled by a plurality of users and/or an automated source. In some examples, a set of individual users federated as a group of administrators is considered a "user."

Although embodiments of the disclosure are discussed in terms of generating predictive data 168 (e.g., outputs indicative of a health of the processing chamber) to perform a corrective action in manufacturing facilities (e.g., substrate processing facilities), in some embodiments, the disclosure can also be generally applied to verifying correct calibration and installation of components. Embodiments can be generally applied to verifying correct calibration and installation based on different types of data.

Figure 1C:
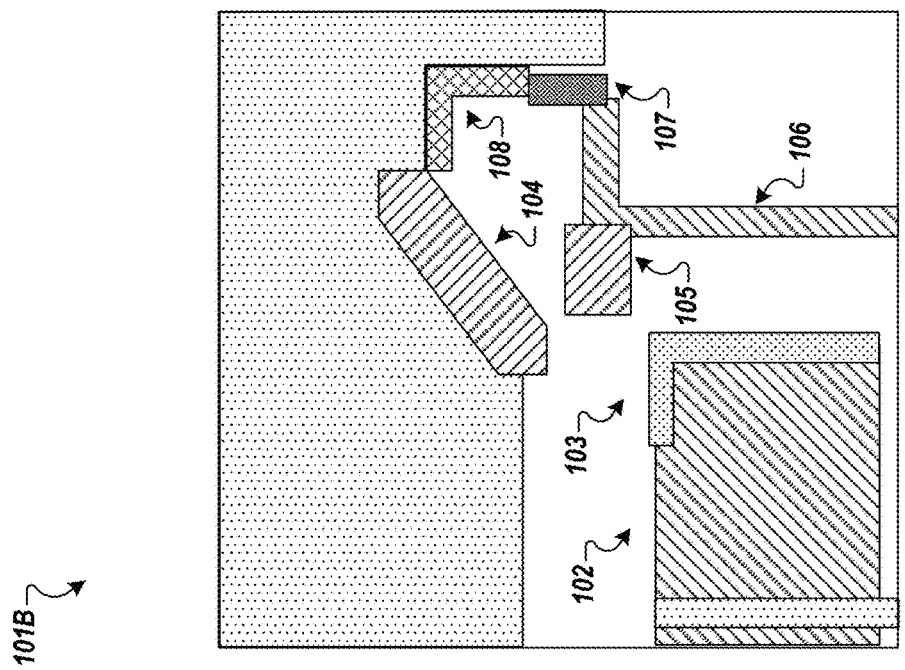
FIGS. 1B-C illustrate a processing chamber of a substrate processing system, according to certain embodiments.
Figure 1B:
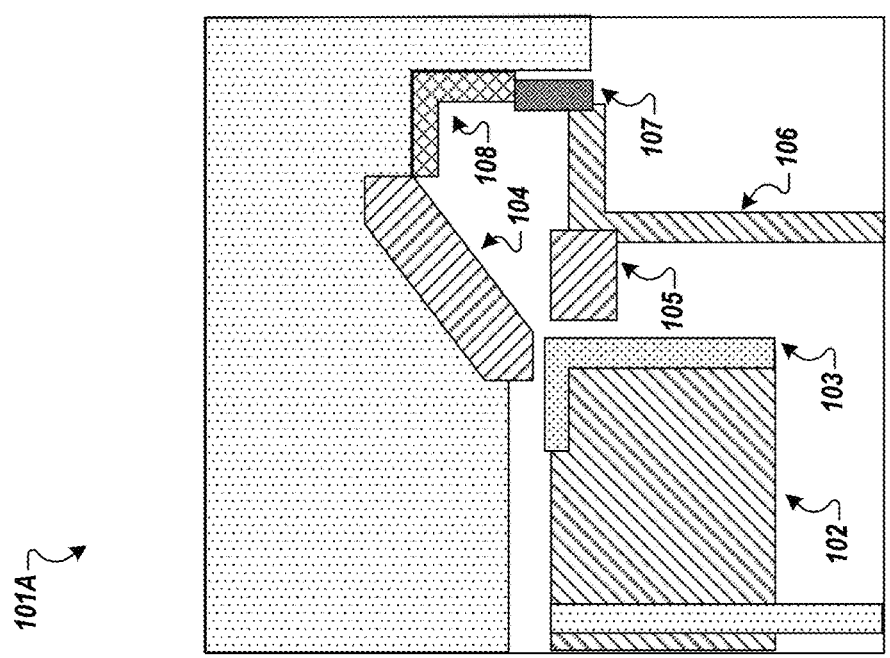

FIGS. 1B-C illustrate a processing chamber 101 of a substrate processing system, according to certain embodiments.

In some embodiments, a vacuum pump (not shown) of the processing chamber 101 is in a fixed position with a fixed pumping efficiency. In some embodiments, the pressure of the processing chamber 101 is checked using about 3000 standard cubic centimeters per minute (sccm) bottom Ar flow. The relative location between the edge ring 103 and inner shield 105 which can be indicated by the pedestal space (e.g., heater spacing between the edge ring 103 and the ceramic isolator 104) in the processing chamber 101 impacts the pumping line conductance (e.g., volumetric flow rate divided by pressure drop). The pressure of the processing chamber 101 reaches a base line pressure with different pumping time if the pumping line conductance is different. After generating a calibrated pumping curve (e.g., graphs 500A-B), the pedestal spacing (e.g., heater spacing) and inner ring quality (e.g., installation of inner shield 105) can be determined based on dynamic pumping data (e.g., sensor data including sensor values received from one or more sensors responsive to directing the processing chamber to have specific heater spacing values).

The processing chamber 101 includes a heater block 102 and an edge ring 103 disposed on the heater block 102. The processing chamber 101 includes a ceramic isolator 104 disposed above the heater block 102 and the edge ring 103. The heater block 102 and edge ring 103 are to be raised and lowered together (e.g., the edge ring 103 remains in the same location on the heater block 102 during the raising and lowering). The distance between the upper surface of the edge ring 103 and the lower surface of the ceramic isolator 104 is referred to as heater spacing. The heater spacing corresponds to an opening between the upper surface of the edge ring 103 and the lower surface of the ceramic isolator 104.

As illustrated in FIG. 1B, the edge ring 103 is in a raised position (e.g., fully choked position) and an upper surface of the edge ring 103 is proximate a lower surface of the ceramic isolator 104 (e.g., to provide heater spacing of 0 mil, 50 mil, 100 mil, or the like.). In the fully choked position, a minimal amount of gas exhausts from the processing chamber.

As illustrated in FIG. 1C, the edge ring 103 is lowered to provide heater spacing between the upper surface of the edge ring 103 and the lower surface of the ceramic isolator 104 (e.g., not fully choked position, etc.). In the not fully choked position, gas flows between the edge ring 103 and the inner shield 105. The processing chamber 101 is calibrated to position the edge ring 103 in different positions relative to the ceramic isolator 104 to provide different heater spacing values to cause different pressure values of exhaust gas between the edge ring and 103 and the inner shield 105.

In some embodiments, the heater spacing is adjustable between 50 and 800 mil. In some embodiments, the heater spacing is adjustable between 100 and 800 mil. In some embodiments, a choking gap is between the edge ring 103 and the inner shield 105 is from 50 to 100 mil. In some embodiments, the choking pressure is $d*A^2$, where d is length of choking and A is the area of choking.

In some embodiments, a pumping curve is created to detect choking effect. In some embodiments, zone 1 of a pumping curve is from about 100 mil to about 300 mil, zone 2 of a pumping curve is from about 300 mil to about 500 mil, and zone 3 of a pumping curve is from 500 mil to 800 mil. Zone 1 (e.g., see FIG. 1B) is fully choked responsive to an upper surface of the edge ring 103 being located above the inner shield 105. Zone 2 is a transition step while the heater block 102 is moving down. Zone 3 (e.g., see FIG. 1C) is a loose choking responsive to an upper surface of the edge ring 103 being located below the inner shield 105.

In some embodiments, the processing chamber 101 further includes one or more of inner shield 105, chamber insert 106, outer shield 107, and top shield 108. In some embodiments, components of a process kit ring include one or more of the edge ring 103, inner shield 105, chamber insert 106, outer shield 107, and top shield 108. In some embodiments, incorrect installation of one or more components of the process kit ring causes one or more of defects in products, defects in components of the substrate processing system, etc. In some embodiments, the components of the process kit ring are ring-shaped (e.g., have a substantially round outer diameter and a substantially round inter diameter). In some embodiments, incorrect installation of a component of the process kit ring includes the component being in an incorrectly rotated position in the processing chamber 101. In some examples, the inner shield 105 is to be aligned with one or more notches in the chamber insert 106. Responsive to the inner shield 105 being in an incorrectly rotated position (e.g., 180 degrees incorrectly rotated, 90 degrees incorrectly rotated, etc.) relative to the notches in the chamber inset 106, the inner shield 105 causes one or more of defects in products, defects in components of the substrate processing system, etc. Responsive to the inner shield 105 being incorrectly positioned (e.g., greater spacing between the inner shield 105 and edge ring 103 on one side and less spacing between the inner shield 105 and the edge ring 103 on another side, inconsistent spacing between the inner shield 105 and the edge ring 103), the processing chamber 101 causes one or more of defects in products, defects in components of the substrate processing system, etc.

The predictive server 112 of FIG. 1A determines predictive data 168 (e.g., outputs indicative of a health of the processing chamber) indicative of an incorrect calibration (e.g., of heater spacing between the edge ring 103 and the ceramic isolator 104) and/or incorrect installation (e.g., of inner shield 105) and causes corrective action (e.g., providing an alert, re-calibration, re-installation, etc.). The predictive server 112 of FIG. 1A determines the predictive data 168 without opening the processing chamber 101 (e.g., while maintaining the sealed environment of the processing chamber 101 and/or substrate processing system). In some embodiments, the predictive server 112 of FIG. 1A causes performance of the corrective action without opening the processing chamber 101 (e.g., without opening the sealed environment of the substrate processing system).

FIG. 2 illustrates a data set generator 272 (e.g., data set generator 172 of FIG. 1) to create data sets for a machine learning model (e.g., model 190 of FIG. 1), according to certain embodiments. In some embodiments, data set generator 272 is part of server machine 170 of FIG. 1.

Data set generator 272 (e.g., data set generator 172 of FIG. 1) creates data sets for a machine learning model (e.g., model 190 of FIG. 1). Data set generator 272 creates data sets using historical sensor data 244 (e.g., historical sensor data 144 of FIG. 1) and historical performance data 262 (e.g., historical performance data 162 of FIG. 1). In some embodiments, the historical sensor data 242 includes historical sensor values 246 and historical spacing values 248 (e.g., historical sensor values 146 and historical spacing values 148 of FIG. 1). System 200 of FIG. 2 shows data set generator 272, data inputs 210, and target output 220.

In some embodiments, data set generator 272 generates a data set (e.g., training set, validating set, testing set) that includes one or more data inputs 210 (e.g., training input, validating input, testing input) and one or more target outputs 220 that correspond to the data inputs 210. The data set also includes mapping data that maps the data inputs 210 to the target outputs 220. Data inputs 210 are also referred to as "features," "attributes," or information." In some embodiments, data set generator 272 provides the data set to the training engine 182, validating engine 184, or testing engine 186, where the data set is used to train, validate, or test the machine learning model 190. Some embodiments of generating a training set are further described with respect to FIG. 4A.

In some embodiments, data set generator 272 generates the data input 210 and target output 220. In some embodiments, data inputs 210 include one or more sets of historical sensor data 244. Each instance of historical sensor data 244 includes one or more of sensor data from one or more types of sensors, combination of sensor data from one or more types of sensors, patterns from sensor data from one or more types of sensors, etc.

In some embodiments, data set generator 272 generates a first data input corresponding to a first set of historical sensor data 244A to train, validate, or test a first machine learning model and the data set generator 272 generates a second data input corresponding to a second set of historical sensor data 244B to train, validate, or test a second machine learning model.

In some embodiments, the data set generator 272 discretizes (e.g., segments) one or more of the data input 210 or the target output 220 (e.g., to use in classification algorithms for regression problems). Discretization (e.g., segmentation via a sliding window) of the data input 210 or target output 220 transforms continuous values of variables into discrete values. In some embodiments, the discrete values for the data input 210 indicate discrete historical sensor data 244 to obtain a target output 220 (e.g., discrete performance data 262).

Data inputs 210 and target outputs 220 to train, validate, or test a machine learning model include information for a particular facility (e.g., for a particular semiconductor manufacturing facility). In some examples, historical sensor data 244 and historical performance data 262 are for the same manufacturing facility.

In some embodiments, the information used to train the machine learning model is from specific types of manufacturing equipment 124 of the manufacturing facility having specific characteristics and allow the trained machine learning model to determine outcomes for a specific group of manufacturing equipment 124 based on input for current sensor data (e.g., current sensor data 152) associated with one or more components sharing characteristics of the specific group. In some embodiments, the information used to train the machine learning model is for components from two or more manufacturing facilities and allows the trained machine learning model to determine outcomes for components based on input from one manufacturing facility.

In some embodiments, subsequent to generating a data set and training, validating, or testing a machine learning model 190 using the data set, the machine learning model 190 is further trained, validated, or tested (e.g., current performance data 164 of FIG. 1) or adjusted (e.g., adjusting weights associated with input data of the machine learning model 190, such as connection weights in a neural network).

Figure 3:
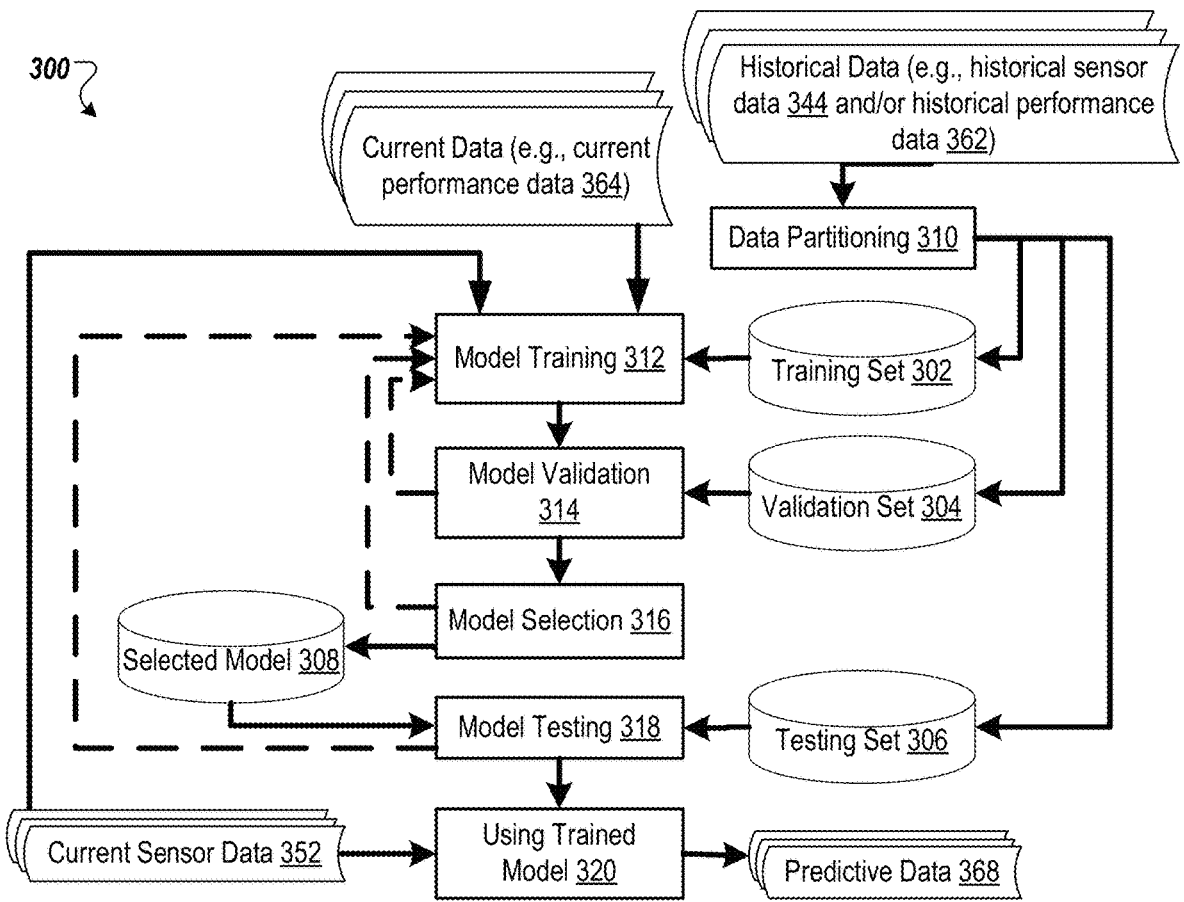
FIG. 3 is a block diagram illustrating determining predictive data, according to certain embodiments.

FIG. 3 is a block diagram illustrating a system 300 for generating predictive data 368 (e.g., predictive data 168 of FIG. 1, outputs indicative of a health of the processing chamber), according to certain embodiments. The system 300 is used to determine predictive data 368 (e.g., model 190 of FIG. 1) to cause a corrective action associated with manufacturing equipment 124 (e.g., recalibration of heater spacing and/or re-installation of a process kit ring).

At block 310, the system 300 (e.g., predictive system 110 of FIG. 1) performs data partitioning (e.g., via data set generator 172 of server machine 170 of FIG. 1) of the historical data (e.g., historical sensor data 344 and historical performance data 362 for model 190 of FIG. 1) to generate the training set 302, validation set 304, and testing set 306. In some examples, the training set is 60% of the historical data, the validation set is 20% of the historical data, and the testing set is 20% of the historical data. The system 300 generates a plurality of sets of features for each of the training set, the validation set, and the testing set. In some examples, if the historical data includes features derived from sensor data from 20 sensors (e.g., sensors 126 of FIGS. 1) and 100 products (e.g., products that each correspond to the sensor data from the 20 sensors), a first set of features is sensors 1-10, a second set of features is sensors 11-20, the training set is products 1-60, the validation set is products 61-80, and the testing set is products 81-100. In this example, the first set of features of the training set would be sensor data from sensors 1-10 for products 1-60.

At block 312, the system 300 performs model training (e.g., via training engine 182 of FIG. 1) using the training set 302. In some embodiments, the system 300 trains multiple models using multiple sets of features of the training set 302 (e.g., a first set of features of the training set 302, a second set of features of the training set 302, etc.). For example, system 300 trains a machine learning model to generate a first trained machine learning model using the first set of features in the training set (e.g., sensor data from sensors 1-10 for products 1-60) and to generate a second trained machine learning model using the second set of features in the training set (e.g., sensor data from sensors 11-20 for products 1-60). In some embodiments, the first trained machine learning model and the second trained machine learning model are combined to generate a third trained machine learning model (e.g., which is a better predictor than the first or the second trained machine learning model on its own in some embodiments). In some embodiments, sets of features used in comparing models overlap (e.g., first set of features being sensor data from sensors 1-15 and second set of features being sensors 5-20). In some embodiments, hundreds of models are generated including models with various permutations of features and combinations of models.

At block 314, the system 300 performs model validation (e.g., via validation engine 184 of FIG. 1) using the validation set 304. The system 300 validates each of the trained models using a corresponding set of features of the validation set 304. For example, system 300 validates the first trained machine learning model using the first set of features in the validation set (e.g., sensor data from sensors 1-10 for products 61-80) and the second trained machine learning model using the second set of features in the validation set (e.g., sensor data from sensors 11-20 for products 61-80). In some embodiments, the system 300 validates hundreds of models (e.g., models with various permutations of features, combinations of models, etc.) generated at block 312. At block 314, the system 300 determines an accuracy of each of the one or more trained models (e.g., via model validation) and determines whether one or more of the trained models has an accuracy that meets a threshold accuracy. Responsive to determining that none of the trained models has an accuracy that meets a threshold accuracy, flow returns to block 312 where the system 300 performs model training using different sets of features of the training set. Responsive to determining that one or more of the trained models has an accuracy that meets a threshold accuracy, flow continues to block 316. The system 300 discards the trained machine learning models that have an accuracy that is below the threshold accuracy (e.g., based on the validation set).

At block 316, the system 300 performs model selection (e.g., via selection engine 185 of FIG. 1) to determine which of the one or more trained models that meet the threshold accuracy has the highest accuracy (e.g., the selected model 308, based on the validating of block 314). Responsive to determining that two or more of the trained models that meet the threshold accuracy have the same accuracy, flow returns to block 312 where the system 300 performs model training using further refined training sets corresponding to further refined sets of features for determining a trained model that has the highest accuracy.

At block 318, the system 300 performs model testing (e.g., via testing engine 186 of FIG. 1) using the testing set 306 to test the selected model 308. The system 300 tests, using the first set of features in the testing set (e.g., sensor data from sensors 1-10 for products 81-100), the first trained machine learning model to determine the first trained machine learning model meets a threshold accuracy (e.g., based on the first set of features of the testing set 306). Responsive to accuracy of the selected model 308 not meeting the threshold accuracy (e.g., the selected model 308 is overly fit to the training set 302 and/or validation set 304 and is not applicable to other data sets such as the testing set 306), flow continues to block 312 where the system 300 performs model training (e.g., retraining) using different training sets corresponding to different sets of features (e.g., sensor data from different sensors). Responsive to determining that the selected model 308 has an accuracy that meets a threshold accuracy based on the testing set 306, flow continues to block 320. In at least block 312, the model learns patterns in the historical data to make predictions and in block 318, the system 300 applies the model on the remaining data (e.g., testing set 306) to test the predictions.

At block 320, system 300 uses the trained model (e.g., selected model 308) to receive current sensor data 352 (e.g., current sensor data 152 of FIG. 1) and determines (e.g., extracts), from the output of the trained model, predictive data 368 (e.g., predictive data 168 of FIG. 1) to perform corrective actions associated with the manufacturing equipment 124. In some embodiments, the current sensor data 352 corresponds to the same types of features in the historical sensor data. In some embodiments, the current sensor data 352 corresponds to a same type of features as a subset of the types of features in historical sensor data that are used to train the selected model 308.

In some embodiments, current data is received. In some embodiments, current data includes current performance data 364 (e.g., current performance data 164 of FIG. 1). In some embodiments, the current data is received from metrology equipment (e.g., metrology equipment 128 of FIG. 1) or via user input. The model 308 is re-trained based on the current data. In some embodiments, a new model is trained based on the current data and the current sensor data 352.

In some embodiments, one or more of the operations 310-320 occur in various orders and/or with other operations not presented and described herein. In some embodiments, one or more of operations 310-320 are not be performed. For example, in some embodiments, one or more of data partitioning of block 310, model validation of block 314, model selection of block 316, and/or model testing of block 318 are not be performed.

Figure 4A:
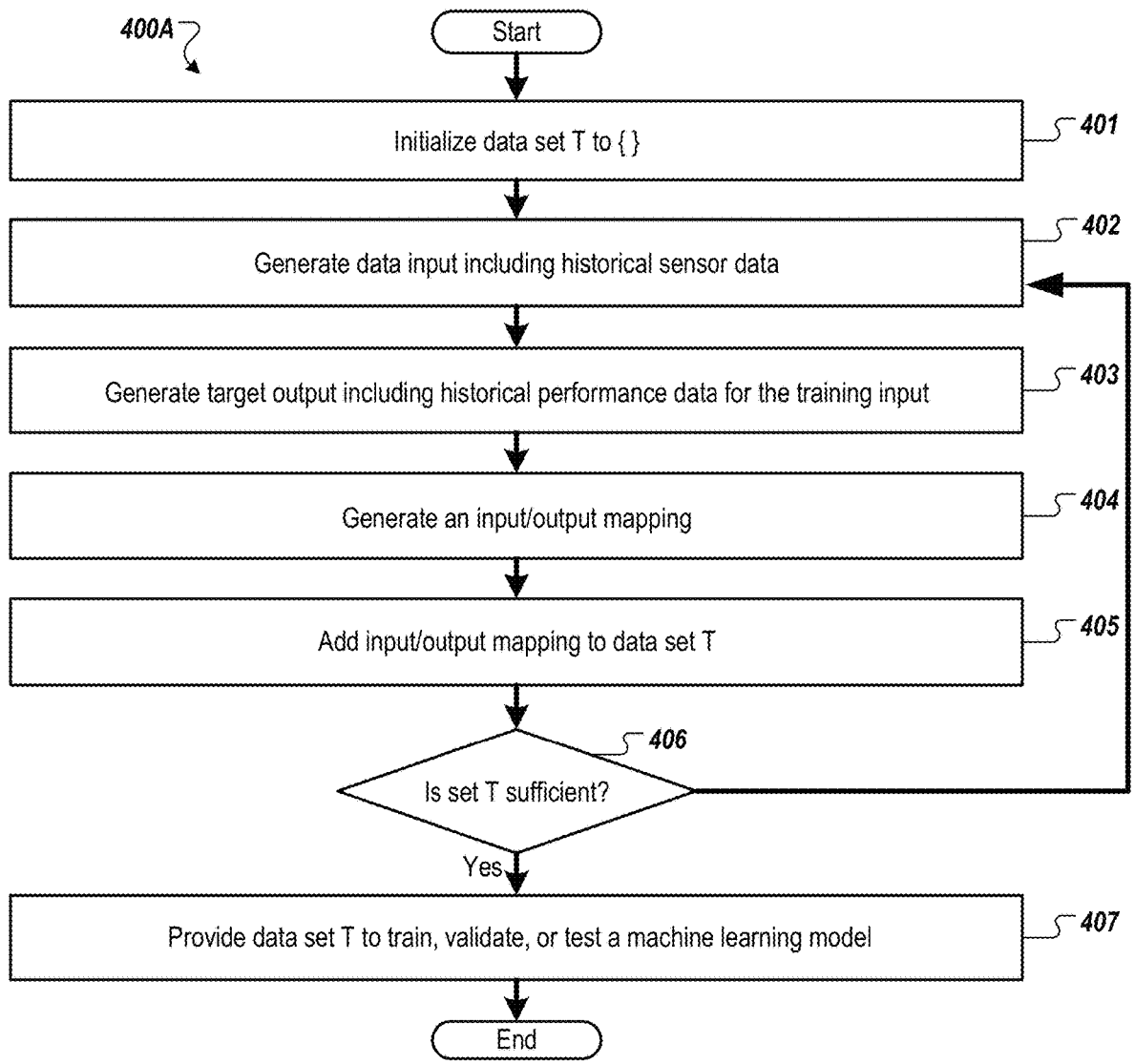
FIGS. 4A-C are flow diagrams of methods associated with generating predictive data to cause a corrective action, according to certain embodiments.
Figure 4B:
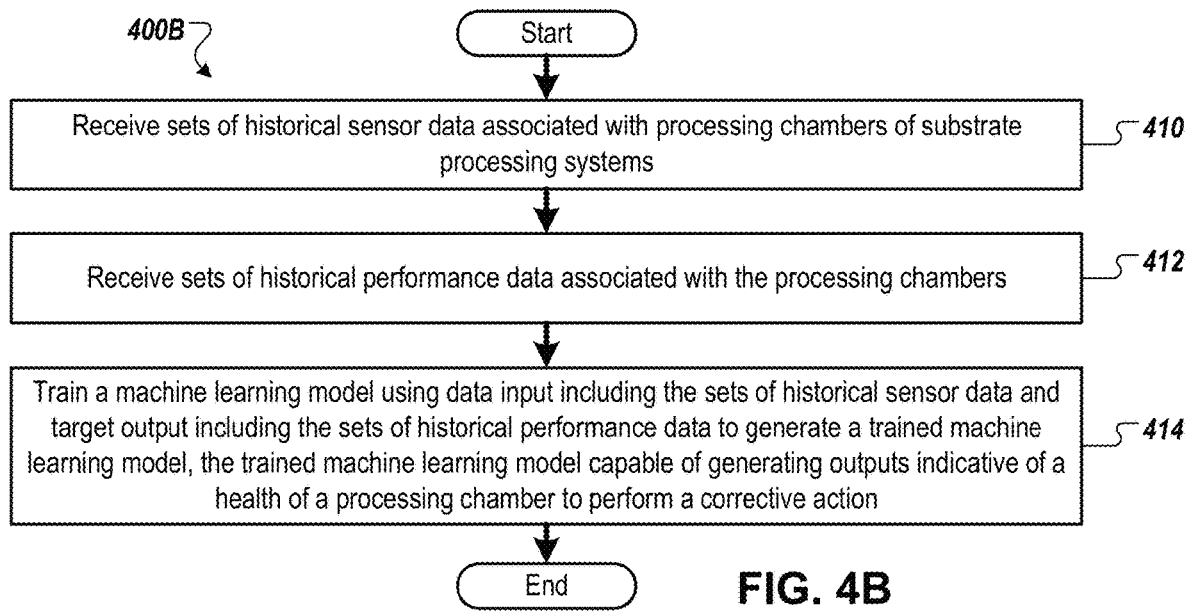
Figure 4C:
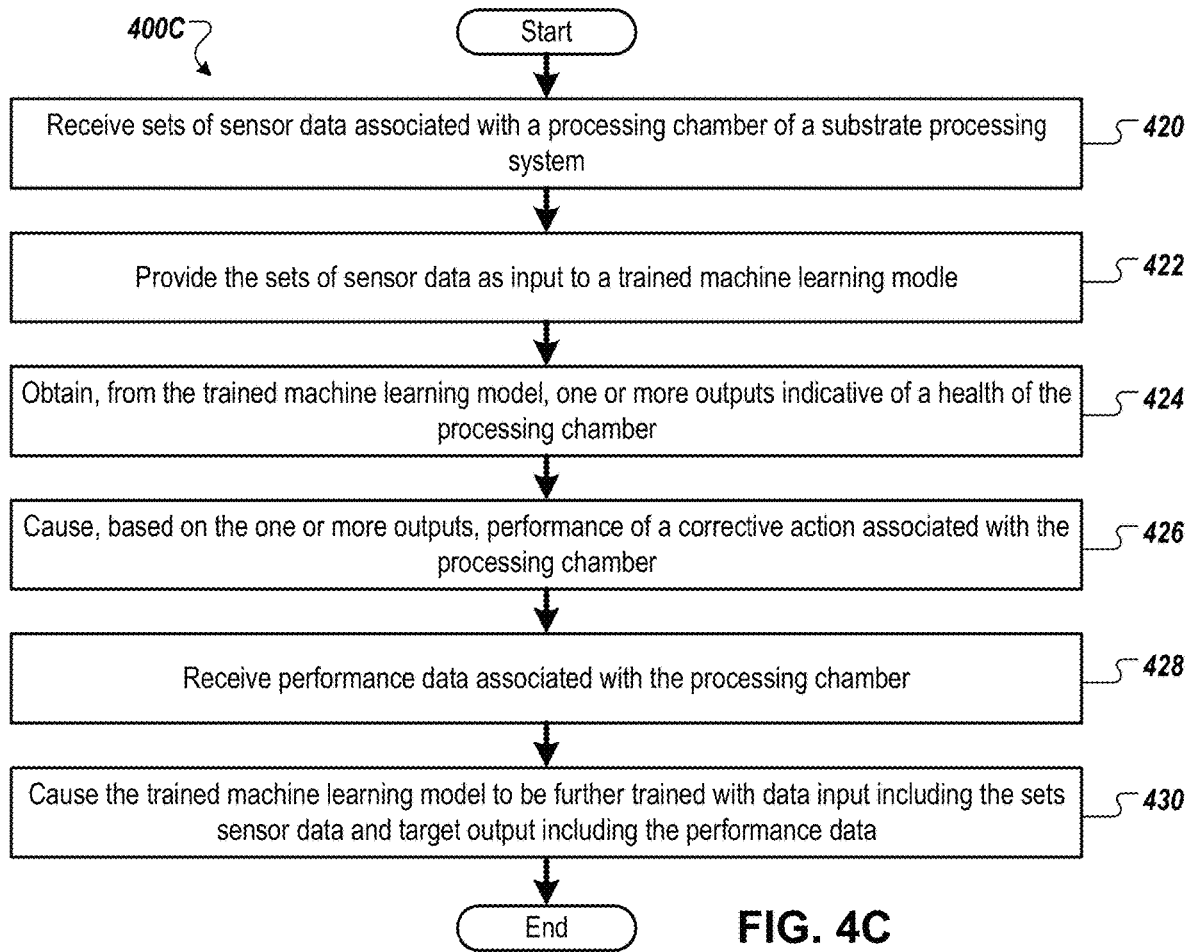

FIGS. 4A-C are flow diagrams of methods 400A-C associated with generating predictive data (e.g., outputs indicative of a health of the processing chamber) to cause a corrective action, according to certain embodiments. In some embodiments, methods 400A-C are performed by processing logic that includes hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiment, methods 400A-C are performed, at least in part, by predictive system 110. In some embodiments, method 400A is performed, at least in part, by predictive system 110 (e.g., server machine 170 and data set generator 172 of FIG. 1A, data set generator 272 of FIG. 2). In some embodiments, predictive system 110 uses method 400A to generate a data set to at least one of train, validate, or test a machine learning model. In some embodiments, method 400B is performed by server machine 180 (e.g., training engine 182, etc.). In some embodiments, method 400C is performed by predictive server 112 (e.g., predictive component 114). In some embodiments, a non-transitory storage medium stores instructions that when executed by a processing device (e.g., of predictive system 110, of server machine 180, of predictive server 112, etc.), cause the processing device to perform one or more of methods 400A-C.

For simplicity of explanation, methods 400A-C are depicted and described as a series of operations. However, operations in accordance with this disclosure can occur in various orders and/or concurrently and with other operations not presented and described herein. Furthermore, in some embodiments, not all illustrated operations are performed to implement methods 400A-C in accordance with the disclosed subject matter. In addition, those skilled in the art will understand and appreciate that methods 400A-C could alternatively be represented as a series of interrelated states via a state diagram or events.

FIG. 4A is a flow diagram of a method 400A for generating a data set for a machine learning model for generating predictive data (e.g., predictive data 168 of FIG. 1, outputs indicative of a health of the processing chamber), according to certain embodiments.

Referring to FIG. 4A, in some embodiments, at block 401 the processing logic implementing method 400A initializes a training set T to an empty set.

At block 402, processing logic generates first data input (e.g., first training input, first validating input) that includes sensor data (e.g., historical sensor data 144 of FIG. 1, historical sensor data 244 of FIG. 2). In some embodiments, the first data input includes a first set of features for types of sensor data and a second data input includes a second set of features for types of sensor data (e.g., as described with respect to FIG. 2).

At block 403, processing logic generates a first target output for one or more of the data inputs (e.g., first data input). In some embodiments, the first target output is historical performance data (e.g., historical performance data 162 of FIG. 1, historical performance data 262 of FIG. 2). In some embodiments, the data input includes historical sensor values mapped to historical spacing values and the historical performance data is associated with whether there were errors in calibration (e.g., of the heater spacing) and/or installation (e.g., of the process kit ring)

At block 404, processing logic optionally generates mapping data that is indicative of an input/output mapping. The input/output mapping (or mapping data) refers to the data input (e.g., one or more of the data inputs described herein), the target output for the data input (e.g., where the target output identifies historical performance data 162), and an association between the data input(s) and the target output.

At block 405, processing logic adds the mapping data generated at block 404 to data set T.

At block 406, processing logic branches based on whether data set T is sufficient for at least one of training, validating, and/or testing machine learning model 190. If so, execution proceeds to block 407, otherwise, execution continues back at block 402. It should be noted that in some embodiments, the sufficiency of data set T is determined based simply on the number of input/output mappings in the data set, while in some other implementations, the sufficiency of data set T is determined based on one or more other criteria (e.g., a measure of diversity of the data examples, accuracy, etc.) in addition to, or instead of, the number of input/output mappings.

At block 407, processing logic provides data set T (e.g., to server machine 180) to train, validate, and/or test machine learning model 190. In some embodiments, data set T is a training set and is provided to training engine 182 of server machine 180 to perform the training. In some embodiments, data set T is a validation set and is provided to validation engine 184 of server machine 180 to perform the validating. In some embodiments, data set T is a testing set and is provided to testing engine 186 of server machine 180 to perform the testing. In the case of a neural network, for example, input values of a given input/output mapping (e.g., numerical values associated with data inputs 210) are input to the neural network, and output values (e.g., numerical values associated with target outputs 220) of the input/output mapping are stored in the output nodes of the neural network. The connection weights in the neural network are then adjusted in accordance with a learning algorithm (e.g., back propagation, etc.), and the procedure is repeated for the other input/output mappings in data set T. After block 407, machine learning model (e.g., machine learning model 190) can be at least one of trained using training engine 182 of server machine 180, validated using validating engine 184 of server machine 180, or tested using testing engine 186 of server machine 180. The trained machine learning model is implemented by predictive component 114 (of predictive server 112) to generate predictive data 168 for performing corrective action associated with the manufacturing equipment 124.

FIG. 4B is a method for training a machine learning model (e.g., model 190 of FIG. 1) for determining predictive data (e.g., predictive data 168 of FIG. 1, outputs indicative of a health of the processing chamber) to perform a corrective action.

Referring to FIG. 4B, at block 410 of method 400B, the processing logic receives sets of historical sensor data (e.g., historical sensor data 144 of FIG. 1A) associated with one or more processing chambers of one or more substrate processing systems. Each of the sets of historical sensor data includes a corresponding historical sensor value (e.g., historical sensor values 146 of FIG. 1A) mapped to a corresponding historical spacing value (e.g., historical spacing values 148 of FIG. 1A).

In some embodiments, each historical spacing value corresponds to a respective distance between an upper surface of an edge ring (e.g., edge ring 103 of FIGS. 1B-C) of a corresponding processing chamber (e.g., processing chamber 101 of FIGS. 1B-C) and a lower surface of a ceramic isolator (e.g., ceramic isolator 104 of FIGS. 1B-C) of the corresponding processing chamber. In some embodiments, each historical spacing value is a directed spacing value (e.g., which is different from an actual spacing value responsive to miscalibration).

In some embodiments, each historical sensor value is associated with an exhaust pressure of gas leaving the corresponding processing chamber via an opening corresponding to the respective distance between the upper surface of the edge ring and the lower surface of the ceramic isolator.

At block 412, the processing logic receives sets of historical performance data (e.g., historical performance data 162 of FIG. 1A) associated with the one or more processing chambers. Each of the sets of the historical performance data corresponds to a respective set of historical sensor data of the sets of historical sensor data. In some embodiments, the historical performance data is indicative of whether the corresponding processing chamber is correctly calibrated (e.g., responsive to directing the processing chamber to cause a particular heater spacing between the edge ring and the ceramic isolator, the resulting heater spacing is within a threshold distance of the particular heater spacing) and/or correctly installed (e.g., one or more components of the process kit ring are within a threshold rotational position of a particular rotational position). In some embodiments, the historical performance data is indicative of an absolute value or relative value of the historical calibration compared to correct calibration and/or historical installation compared to correct installation. In some embodiments, the historical performance data indicates that all of the historical sensor data is for correctly calibrated and correctly installed processing chambers.

At block 414, the processing logic trains a machine learning model using data input including the sets of historical sensor data and target output including the historical performance data to generate a trained machine learning model. The trained machine learning model is capable of generating outputs indicative of a health of a processing chamber, predictive data (e.g., predictive data 168) to cause performance of one or more corrective actions associated with a processing chamber (e.g., processing chamber 101 of FIGS. 1B-C) of a substrate processing system.

FIG. 4C is a method 400C for using a trained machine learning model (e.g., model 190 of FIG. 1) for determining predictive data (e.g., outputs indicative of a health of the processing chamber) to cause performance of a corrective action.

Referring to FIG. 4C, at block 420 of method 400C, the processing logic receives sets of sensor data (e.g., current sensor data 152 of FIG. 1A) associated with a processing chamber (e.g. processing chamber 101 of FIG. 1B-C) of a substrate processing system. Each of the sets of sensor data include a corresponding sensor value (e.g., current sensor value 156 of FIG. 1A) of the processing chamber mapped to a corresponding spacing value (e.g., current spacing value 158 of FIG. 1A) of the processing chamber. In some embodiments, the sensor value is a measured sensor value (e.g., via one or more sensor values of one or more sensors 126 of FIG. 1B) and the spacing value is a directed spacing value (e.g., the predictive server 112, the controller of the substrate processing system, etc. directs the spacing value).

Each spacing value corresponds to a distance (e.g., directed distance) between an upper surface of an edge ring (e.g., edge ring 103 of FIG. 1B) of the processing chamber and a lower surface of a ceramic isolator (e.g., ceramic isolator 104 of FIG. 1B) of the processing chamber.

In some embodiments, a sensor value is a pressure value associated with exhaust pressure (e.g., measured by a sensor) of a gas exiting (e.g., leaving the processing chamber) via an opening corresponding to a distance (e.g., an actual distance) between the upper surface of the edge ring and the lower surface of the ceramic isolator.

In some embodiments, block 420 is after one or more of performing preventative maintenance on the processing chamber (e.g., opening, performing preventative maintenance, calibrating, and closing the processing chamber) or installation of the processing chamber (e.g., installation, calibration, and closing of the processing chamber.).

At block 422, the processing logic provides the sets of sensor data as input to a trained machine learning model (e.g., the trained machine learning model of block 414 of FIG. 4B).

At block 424, the processing logic obtains, from the trained machine learning model, one or more outputs indicative of a health of the processing chamber (e.g., predictive data 168 of FIG. 1A).

At block 426, the processing logic causes, based on the one or more outputs (e.g., predictive data), performance of a corrective action associated with the processing chamber.

In some embodiments, the one or more outputs (e.g., predictive data) of block 424 is indicative of an error in calibration of heater spacing of the processing chamber and the performance of the corrective action of block 426 includes providing an alert and/or causing recalibration of the heater spacing of the processing chamber. The heater spacing includes distances between the upper surface of the edge ring and the lower surface of the ceramic isolator.

In some embodiments, the one or more outputs (e.g., predictive data) of block 424 is indicative of an error in installation of a process kit ring in the processing chamber and the performance of the corrective action of block 426 includes providing an alert and/or causing re-installation of the process kit ring in the processing chamber.

At block 428, processing logic receives performance data (e.g., current performance data 164 of FIG. 1A) associated with the processing chamber (e.g., associated with the sets of sensor data from block 420). In some embodiments, the performance data is indicative of actual miscalibration values and/or actual installation positions of one or more components of the process kit ring.

At block 430, processing logic causes the trained machine learning model to be further trained (e.g., re-trained) with data input including the sets of sensor data (e.g., from block 420) and target output including the performance data (e.g., from block 428).

In some embodiments, blocks 420-424 are repeated until the one or more outputs (e.g., predictive data) indicates that no further corrective actions are to be performed (e.g., the predictive data is indicative of calibration values and installation values meet threshold values).

Figure 5A:
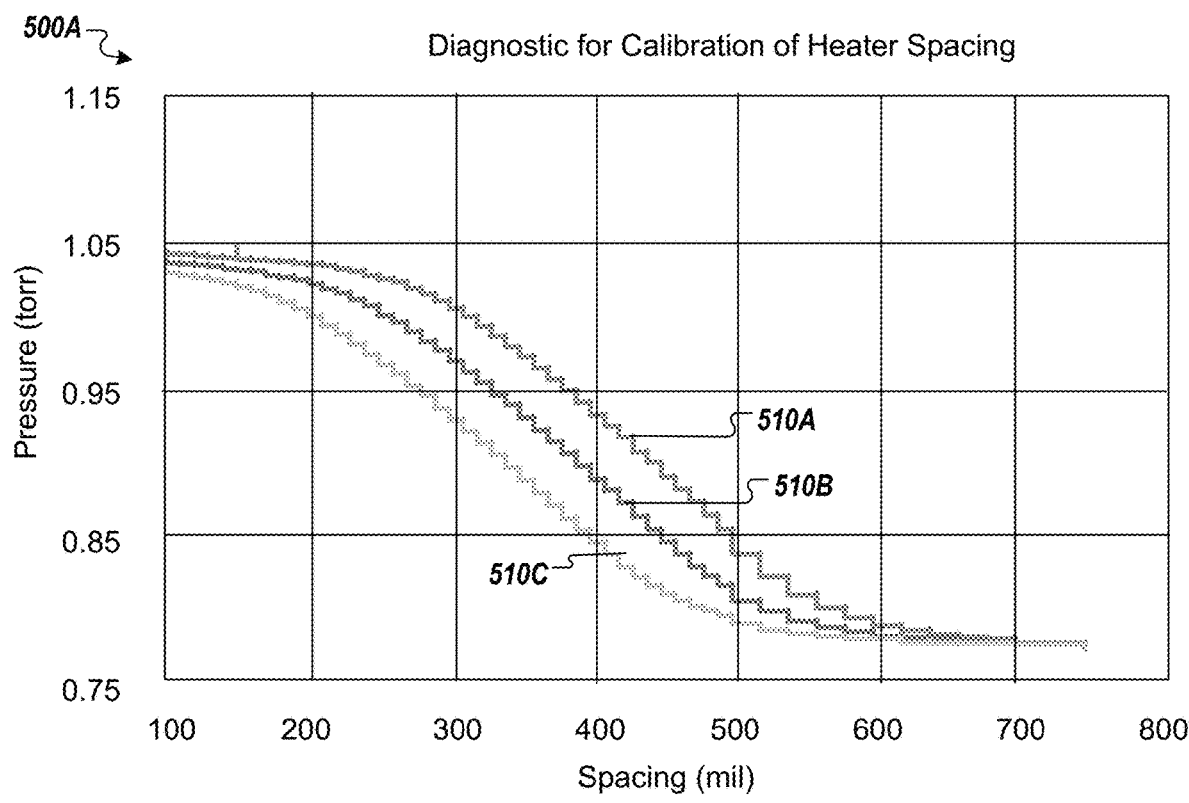
FIGS. 5A-B are graphs associated with generating predictive data to cause a corrective action, according to certain embodiments.
Figure 5B:
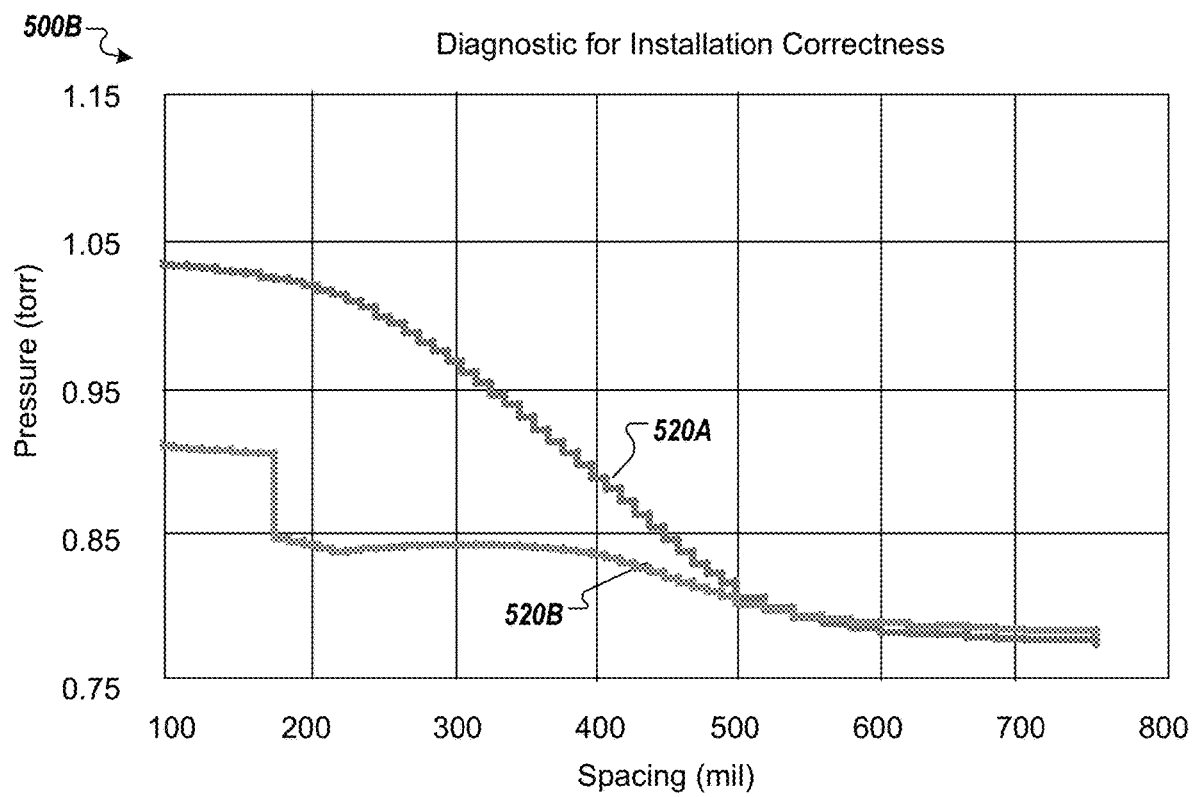

FIGS. 5A-B are graphs 500A-B associated with generating predictive data (e.g., outputs indicative of a health of the processing chamber) to cause a corrective action, according to certain embodiments.

Referring to FIG. 5A, graph 500A is a diagnostic for calibration of heater spacing. Different heater spacing values (e.g., a distance between an edge ring 103 and a ceramic isolator 104 of FIG. 1B) are mapped to different sensor values (e.g., pressure values associated with exhaust pressure of gas exiting through the distance between the edge ring 103 and ceramic isolator 104 of FIG. 1B). In some embodiments, responsive to a controller directing a particular heater spacing, the resulting heater spacing is different from the particular heater spacing.

The graph 500A plots pressure values (e.g., Torr) against heater spacing values (mil). The different lines 510 (e.g., pumping curves) are associated with different calibrations. Line 510A is a correctly calibrated processing chamber (e.g., the resulting heater spacing value is the same as the directed heater spacing value). Line 510B is miscalibrated by +50 mil (e.g., responsive to directing the heater spacing value of 10 mil, the resulting heater spacing value is 60 mil). Line 510C is miscalibrated by +100 mil (e.g., responsive to directing the heater spacing value of 10 mil, the resulting heater spacing value is 100 mil). In some embodiments, the line 510 (e.g., pumping curve) is used to detect the miscalibration of the heater spacing. The heater spacing delta at same pressure values between the two curves represents the miscalibration value. In some embodiments, the trained machine learning model (e.g., model 190 of FIG. 1A) generates pumping curves (e.g., lines 510 of graph 500A) based on the historical sensor data (e.g., historical pressure values and/or historical spacing values) and historical performance data (e.g., miscalibration values and/or historical spacing values). In some embodiments, trained machine learning model compares the current sensor data (e.g., current pressure values, current spacing values) to the pumping curves (e.g., lines 510 of graph 500A) to determine predictive data (e.g., outputs indicative of a health of the processing chamber, miscalibration values, whether the calibration meets a threshold calibration).

Referring to FIG. 5B, graph 500B is a diagnostic for installation correctness. One more components (e.g., inner shield 105 of FIGS. 1B-C) of the process kit ring are to be installed in a particular orientation (e.g., rotation position based on notches). In some embodiments, at least a portion of a process kit ring (e.g., one or more components of a process kit ring) are installed incorrectly (e.g., rotated 180 degrees from the correct installation orientation).

The graph 500B plots pressure values (e.g., Torr) against heater spacing values (mil). The different lines 520 (e.g., pumping curves) are associated with different installations. Line 520A is a correctly installed process kit ring (e.g., inner shield of the process kit ring). Line 520B is an incorrectly installed process kit ring (e.g., inner shield was installed 180 degrees rotated from the correct orientation). In some embodiments, the line 520 (e.g., pumping curve) is used to detect whether a process kit ring is correctly installed. In some embodiments, the trained machine learning model (e.g., model 190 of FIG. 1A) generates pumping curves (e.g., lines 520 of graph 500B) based on the historical sensor data (e.g., historical pressure values and/or historical spacing values) and historical performance data (e.g., miscalibration values and/or historical spacing values). In some embodiments, trained machine learning model compares the current sensor data (e.g., current pressure values, current spacing values) to the pumping curves (e.g., lines 520 of graph 500B) to determine predictive data (e.g., outputs indicative of a health of the processing chamber, whether the pumping curve matches a correctly installed process kit ring or an incorrectly installed process kit ring).

Figure 6:
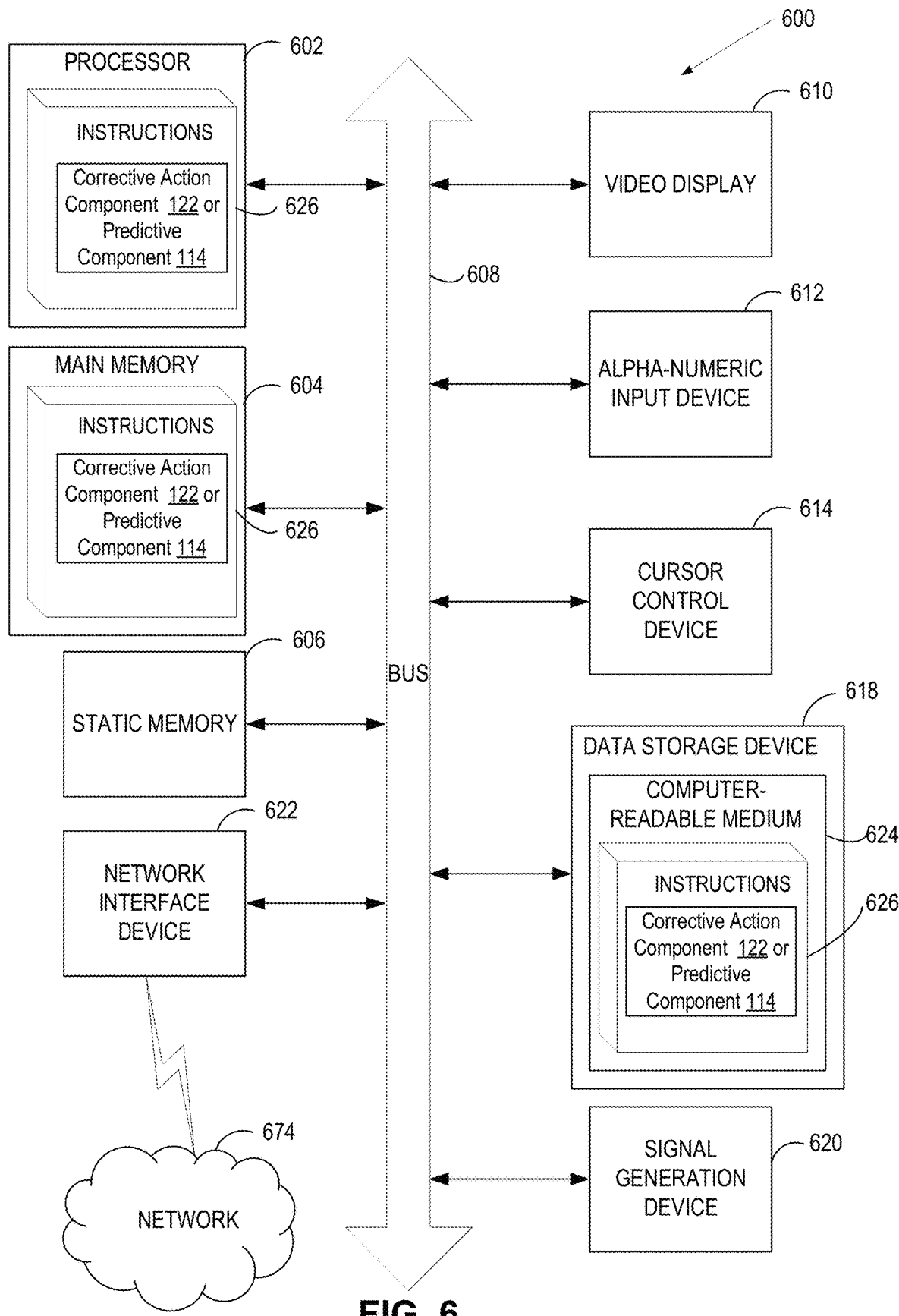
FIG. 6 is a block diagram illustrating a computer system, according to certain embodiments.

FIG. 6 is a block diagram illustrating a computer system 600, according to certain embodiments. In some embodiments, the computer system 400 is one or more of client device 120, predictive system 110, server machine 170, server machine 180, or predictive server 112.

In some embodiments, computer system 600 is connected (e.g., via a network, such as a Local Area Network (LAN), an intranet, an extranet, or the Internet) to other computer systems. In some embodiments, computer system 600 operates in the capacity of a server or a client computer in a client-server environment, or as a peer computer in a peer-to-peer or distributed network environment. In some embodiments, computer system 600 is provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 600 includes a processing device 602, a volatile memory 604 (e.g., Random Access Memory (RAM)), a non-volatile memory 606 (e.g., Read-Only Memory (ROM) or Electrically-Erasable Programmable ROM (EEPROM)), and a data storage device 616, which communicate with each other via a bus 608.

In some embodiments, processing device 602 is provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

In some embodiments, computer system 600 further includes a network interface device 622 (e.g., coupled to network 674). In some embodiments, computer system 600 also includes a video display unit 610 (e.g., an LCD), an alphanumeric input device 612 (e.g., a keyboard), a cursor control device 614 (e.g., a mouse), and a signal generation device 620.

In some implementations, data storage device 616 includes a non-transitory computer-readable storage medium 624 on which store instructions 626 encoding any one or more of the methods or functions described herein, including instructions encoding components of FIG. 1A (e.g., corrective action component 122, predictive component 114, etc.) and for implementing methods described herein.

In some embodiments, instructions 626 also reside, completely or partially, within volatile memory 604 and/or within processing device 602 during execution thereof by computer system 600, hence, in some embodiments, volatile memory 604 and processing device 602 also constitute machine-readable storage media.

While computer-readable storage medium 624 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

In some embodiments, the methods, components, and features described herein are implemented by discrete hardware components or are integrated in the functionality of other hardware components such as ASICS, FPGAs, DSPs or similar devices. In some embodiments, the methods, components, and features are implemented by firmware modules or functional circuitry within hardware devices. In some embodiments, the methods, components, and features are implemented in any combination of hardware devices and computer program components, or in computer programs.

Unless specifically stated otherwise, terms such as "receiving," "providing," "obtaining," "causing," "determining," "training," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. In some embodiments, the terms "first," "second," "third," "fourth," etc. as used herein are meant as labels to distinguish among different elements and do not have an ordinal meaning according to their numerical designation.

Examples described herein also relate to an apparatus for performing the methods described herein. In some embodiments, this apparatus is specially constructed for performing the methods described herein, or includes a general purpose computer system selectively programmed by a computer program stored in the computer system. Such a computer program is stored in a computer-readable tangible storage medium.

The methods and illustrative examples described herein are not inherently related to any particular computer or other apparatus. In some embodiments, various general purpose systems are used in accordance with the teachings described herein. In some embodiments, a more specialized apparatus is constructed to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

The invention claimed is:

1. A method comprising:
receiving a plurality of sets of sensor data associated with a processing chamber of a substrate processing system, wherein each of the plurality of sets of sensor data comprises a corresponding sensor value of the processing chamber mapped to a corresponding spacing value of the processing chamber, wherein the corresponding spacing value corresponds to a respective distance between an upper surface of an edge ring of the processing chamber and a lower surface of a ceramic isolator of the processing chamber;
providing the plurality of sets of sensor data as input to a trained machine learning model;
obtaining, from the trained machine learning model, one or more outputs indicative of a health of the processing chamber; and
causing, based on the one or more outputs, performance of one or more corrective actions associated with adjusting the respective distance between the edge ring and the ceramic isolator.

2. The method of claim 1, wherein the corresponding sensor value is:
a corresponding pressure value of the processing chamber; or
a corresponding pumping efficiency value associated with the processing chamber.

3. The method of claim 1, wherein the corresponding sensor value is a corresponding pressure value associated with exhaust pressure of gas leaving the processing chamber via an opening between the upper surface of the edge ring and the lower surface of the ceramic isolator.

4. The method of claim 1, wherein the receiving of the plurality of sets of sensor data is after one or more of performing preventative maintenance on the processing chamber or installation of the processing chamber.

5. The method of claim 1, wherein the one or more outputs are indicative of an error in calibration of heater spacing of the processing chamber, and wherein the performance of the one or more corrective actions comprises one or more of providing an alert or causing recalibration of the heater spacing of the processing chamber.

6. The method of claim 5, and wherein the heater spacing comprises a plurality of distances between the upper surface of the edge ring and the lower surface of the ceramic isolator.

7. The method of claim 1, wherein the one or more outputs are indicative of an error in installation of a process kit ring in the processing chamber, and wherein the performance of the one or more corrective actions comprises one or more of providing an alert or causing re-installation of the process kit ring in the processing chamber.

8. The method of claim 1 further comprising:
receiving performance data associated with the processing chamber; and
causing the trained machine learning model to be further trained with data input comprising the plurality of sets of sensor data and target output comprising the performance data.

9. A method comprising:
receiving a plurality of sets of historical sensor data associated with one or more processing chambers of one or more substrate processing systems, wherein each of the plurality of sets of historical sensor data comprises a corresponding historical sensor value mapped to a corresponding historical spacing value, wherein the corresponding historical spacing value corresponds to a respective distance between an upper surface of an edge ring of a corresponding processing chamber and a lower surface of a cermaic isolator of the corresponding processing chamber;
receiving a plurality of sets of historical performance data associated with the one or more processing chambers, wherein each of the plurality of sets of historical performance data corresponds to a respective set of historical sensor data of the plurality of sets of historical sensor data; and
training a machine learning model with data input comprising the plurality of sets of historical sensor data and target output comprising the plurality of sets of historical performance data to generate a trained machine learning model, the trained machine learning model being capable of generating one or more outputs indicative of a health of a processing chamber to cause performance of one or more corrective actions associated with adjusting the respective distance between the edge ring and the ceramic isolator.

10. The method of claim 9, wherein the corresponding historical sensor value is a corresponding historical pressure value associated with exhaust pressure of gas leaving the corresponding processing chamber via an opening between the upper surface of the edge ring and the lower surface of the ceramic isolator.

11. The method of claim 9, wherein:
the one or more outputs are indicative of an error in calibration of heater spacing of the processing chamber;
the performance of the one or more corrective actions comprises one or more of providing an alert or causing recalibration of the heater spacing of the processing chamber; and
the heater spacing comprises a plurality of distances between the upper surface of the edge ring and the lower surface of the ceramic isolator.

12. The method of claim 9, wherein the one or more outputs are indicative of an error in installation of a process kit ring in the processing chamber, and wherein the performance of the one or more corrective actions comprises one or more of providing an alert or causing re-installation of the process kit ring in the processing chamber.

13. A non-transitory machine-readable storage medium storing instructions which, when executed cause a processing device to perform operations comprising:
- receiving a plurality of sets of sensor data associated with a processing chamber of a substrate processing system, wherein each of the plurality of sets of sensor data comprises a corresponding sensor value of the processing chamber mapped to a corresponding spacing value of the processing chamber, wherein the corresponding spacing value corresponds to a respective distance between an upper surface of an edge ring of the processing chamber and a lower surface of a ceramic isolator of the processing chamber;
- providing the plurality of sets of sensor data as input to a trained machine learning model;
- obtaining, from the trained machine learning model, one or more outputs indicative of a health of the processing chamber; and
- causing, based on the one or more outputs, performance of one or more corrective actions associated with adjusting the respective distance between the edge ring and the ceramic isolator.

14. The non-transitory machine-readable storage medium of claim 13, wherein:
- the respective distance is between the upper surface of the edge ring and the lower surface of the ceramic isolator; and
- the corresponding sensor value is a corresponding pressure value associated with exhaust pressure of gas leaving the processing chamber via an opening between the upper surface of the edge ring and the lower surface of the ceramic isolator.

15. The non-transitory machine-readable storage medium of claim 13, wherein the receiving of the plurality of sets of sensor data is after one or more of performing preventative maintenance on the processing chamber or installation of the processing chamber.

16. The non-transitory machine-readable storage medium of claim 13, wherein:
- the one or more outputs are indicative of an error in calibration of heater spacing of the processing chamber;
- the performance of the one or more corrective actions comprises one or more of providing an alert or causing recalibration of the heater spacing of the processing chamber; and
- the heater spacing comprises a plurality of distances between the upper surface of the edge ring and the lower surface of the ceramic isolator.

17. The non-transitory machine-readable storage medium of claim 13, wherein the one or more outputs are indicative of an error in installation of a process kit ring in the processing chamber, and wherein the performance of the one or more corrective actions comprises one or more of providing an alert or causing re-installation of the process kit ring in the processing chamber.

18. The non-transitory machine-readable storage medium of claim 13, the operations further comprising:
- receiving performance data associated with the processing chamber; and
- causing the trained machine learning model to be further trained with data input comprising the plurality of sets of sensor data and target output comprising the performance data.

* * * * *